(12) United States Patent
Chang

(10) Patent No.: US 12,347,792 B2
(45) Date of Patent: Jul. 1, 2025

(54) DUMMY PATTERN STRUCTURE FOR REDUCING DISHING

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/488,052

(22) Filed: Oct. 17, 2023

(65) Prior Publication Data

US 2024/0047380 A1  Feb. 8, 2024

Related U.S. Application Data

(62) Division of application No. 17/546,003, filed on Dec. 8, 2021, now Pat. No. 12,033,959.

(60) Provisional application No. 63/182,710, filed on Apr. 30, 2021.

(51) Int. Cl.
*H01L 23/00* (2006.01)
*H01L 25/00* (2006.01)
*H01L 25/065* (2023.01)

(52) U.S. Cl.
CPC ............ *H01L 23/562* (2013.01); *H01L 24/08* (2013.01); *H01L 24/80* (2013.01); *H01L 25/0652* (2013.01); *H01L 25/50* (2013.01); *H01L 2224/08145* (2013.01); *H01L 2224/80895* (2013.01); *H01L 2224/80896* (2013.01)

(58) Field of Classification Search
None
See application file for complete search history.

(56) References Cited

U.S. PATENT DOCUMENTS

| | | | |
|---|---|---|---|
| 11,282,751 | B2 | 3/2022 | Hsieh et al. |
| 2004/0084777 | A1 | 5/2004 | Yamanoue et al. |
| 2009/0032928 | A1* | 2/2009 | Chiang ............... H01L 29/0657 438/126 |
| 2015/0076655 | A1 | 3/2015 | Choi et al. |
| 2017/0373187 | A1 | 12/2017 | Birner et al. |
| 2019/0305078 | A1 | 10/2019 | Wu et al. |
| 2020/0135580 | A1 | 4/2020 | Hsieh et al. |
| 2022/0085037 | A1 | 3/2022 | Chung et al. |
| 2022/0102369 | A1 | 3/2022 | Chung et al. |
| 2022/0208615 | A1 | 6/2022 | Hsieh et al. |

* cited by examiner

*Primary Examiner* — Telly D Green
(74) *Attorney, Agent, or Firm* — KILPATRICK TOWNSEND & STOCKTON LLP

(57) ABSTRACT

A device includes a substrate, at least one first dielectric layer on the substrate and including a first dielectric constant, at least one second dielectric layer on the at least one first dielectric layer and including a second dielectric constant greater than the first dielectric constant, and a dummy pattern including a first conductive pattern having a first pattern density in the at least one first dielectric layer and a second conductive pattern in the at least one second dielectric layer and comprising a second pattern density. The first pattern density is equal to or greater than the second pattern density.

20 Claims, 13 Drawing Sheets

DUMMY PATTERN STRUCTURE FOR REDUCING DISHING

CROSS-REFERENCES TO RELATED APPLICATIONS

The present application is a divisional application of U.S. patent application Ser. No. 17/546,003, filed Dec. 8, 2021, which claims priority to U.S. Provisional Patent Application 63/182,710, filed on Apr. 30, 2021, and entitled "Vertical SoIC Contact Circuit Dummy Pattern," the entire disclosure of which is incorporated herein by reference.

TECHNICAL FIELD

The present disclosure relates to pattern layouts for stacked die assemblies, and more particularly to metal layer structures for reducing dishing and erosion effects.

BACKGROUND

Semiconductor dies can be electrically connected with other circuitry in a package substrate. The package substrate provides for electrical connection to other circuitry on a printed circuit board. Semiconductor dies can have different functions and are difficult to be processed using the same semiconductor processing techniques, so they are manufactured separately. A large multi-functional device having high performance can be obtained by assembling multiple dies into the device. The multiple dies can be stacked together to form die groups, and the die groups are planarized to have a flat surface for bonding to a planar substrate. The planarization can be achieved by chemical mechanically polishing (CMP) processes. However, different layers of the dies or die groups may have different materials with different polish rates that can cause dishing and erosion effects.

BRIEF DESCRIPTION OF THE DRAWINGS

The present disclosure is best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
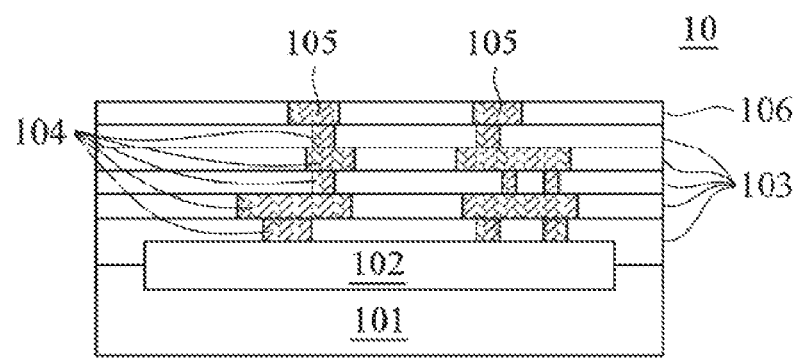
FIG. 1 is a cross-sectional view of a semiconductor device structure according to some exemplary embodiments.

The following disclosure provides many different embodiments or examples for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Prepositions, such as "on" and "side" (as in "sidewall") are defined with respect to the conventional plane or surface being on the top surface of the wafer or substrate, regardless of the orientation of the wafer or substrate. The term "horizontal" is defined as a plane parallel to the conventional plane or surface of a wafer or substrate, regardless of the orientation of the wafer or substrate. The term "vertical" refers to a direction perpendicular to the horizontal as defined above, i.e., perpendicular to the surface of a substrate. The terms "first," "second," "third," and "fourth" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element component, region, layer or section discussed below could be termed a second element, component, region, layer or section without departing from the teachings of the present disclosure.

There are many packaging technologies to house the semiconductors, such as the 2D fan-out (chip-first) IC integration, 2D flip chip IC integration, PoP (package-on-package), SiP (system-in-package) or heterogeneous integration, 2D fan-out (chip-last) IC integration, 2.1D flip chip IC integration, 2.1D flip chip IC integration with bridges, 2.1D fan-out IC integration with bridges, 2.3D fan-out (chip-first) IC integration, 2.3D flip chip IC integration, 2.3D fan-out (chip-last) IC integration, 2.5D (solder bump) IC integration, 2.5D (μbump) IC integration, μhump 3D IC integration, μhump chiplets 3D IC integration, bumpless 3D IC integration, bumpless chiplets 3D IC integration, SoIC™ and/or any other packaging technologies. It should be understood that, although various embodiments disclosed herein are described and illustrated in a context of a specific semiconductor packaging technology, it is not intended to limit the present disclosure only to that packaging technology. One skilled in the art would understand those embodiments may be applied in other semiconductor technologies in accordance with principles, concepts, motivations, and/or insights provided by the present disclosure.

System on integrated chip (SoIC™) is a recent development in advanced packaging technologies. SoIC™ technology that integrates both homogeneous and heterogeneous chiplets into a single System-on-Chip (SoC)-like chip with a smaller footprint and thinner profile, which can be holistically integrated into advanced WLSI (aka CoWoS® service and InFO). From external appearance, the newly integrated chip is just like a general SoC chip yet embedded with desired and heterogeneously integrated functionalities. SoIC realizes 3D chiplets integration with additional advantages in performance, power and form factor. Among many other features, the SoIC™ features ultra-high-density-vertical stacking for high performance, low power, and min. RLC (resistance-inductance-capacitance). SoIC integrates active and passive chips into a new integrated-SoC system to achieve better form factor and performance. US Patent Publication #20200168527, entitled "SoIC chip architecture," provides some descriptions about some example SoIC structures. US Patent Publication #20200168527 is incorporated by reference in its entirety. Another example of SoIC™ can be found at https://3dfabric.tsmc.com/english/dedicatedFoundry/technology/SoIC.htm, which is also incorporated by reference in the present disclosure in its entirety.

Numerous benefits and advantages are achieved by way of the present disclosure over conventional techniques. For example, embodiments provide a conductive pattern layout structure in at least one intermetal layer that can reduce or eliminate dishing and erosion effects. Embodiments overcome problems associated with planarization of semiconductor devices, in particularly, when the planarization involves using polishing pads on a side surface of a semiconductor device having different dielectric layers with different polish rates. These and other embodiments of the disclosure, along with many of its advantages and features, are described in more detail in conjunction with the text below and corresponding figures.

Exemplary embodiments described herein relate to multi-chip devices having vertically stacked chips disposed on a base substrate. As used herein, chips and dies are used interchangeably and refer to pieces of a semiconductor wafer, to which a semiconductor manufacturing process has been performed, formed by separating the semiconductor wafer into individual dies. A chip or die can include a processed semiconductor circuit having a same hardware layout or different hardware layouts, or same functions or different functions. In general, a chip or die has a substrate, a plurality of metal lines, a plurality of dielectric layers interposed between the metal lines, a plurality of vias electrically connecting the metal lines, and active and/or passive devices. The dies can be assembled together to be a multi-chip device or a die group. As used herein, a chip or die can also refer to an integrated circuit including a circuit configured to process and/or store data. Examples of a chip, die, or integrated circuit include a field programmable gate array (e.g., FPGA), a processing unit, e.g., a graphics processing unit (GPU) or a central processing unit (CPU), an application specific integrated circuit (ASIC), memory devices (e.g., memory controller, memory), and the like.

Dies and Die Groups in Accordance with the Present Disclosure

In this section, an example individual die structure, an example stacked die structure in a die group, and an example wafer-on-wafer configuration having the example stacked die structure are provided to illustrate some embodiments where the present disclosure may be applied. It should be understood that the examples shown in this section are merely illustrative for understanding how the present disclosure may be applied in those examples. Thus, these examples should not be construed as being intended to limit the present disclosure. One skilled in the art will understand the present disclosure may be applied in other semiconductor packaging technologies wherever appropriate.

An Example Individual Die Structure in Accordance with the Present Disclosure

FIG. 1 is a cross-sectional view of a semiconductor device 10 according to some exemplary embodiments. Referring to FIG. 1, the semiconductor device 10 includes a substrate 101, an active region 102 formed on a surface of the substrate 101, a plurality of dielectric layers 103, a plurality of metal lines and a plurality of vias 104 formed in the dielectric layers 103, and a metal structure 105 in a top intermetal layer 106. In an embodiment, the semiconductor device 10 also includes passive devices, such as resistors, capacitors, diodes, inductors, and the like. The substrate 101 can be a semiconductor substrate or a non-semiconductor substrate. For example, the substrate 101 may include a bulk silicon substrate. In some embodiments, the substrate 101 may include an elementary semiconductor, such as silicon or germanium in a crystalline structure; a compound semiconductor, e.g., silicon germanium; silicon carbide; gallium arsenic; gallium phosphide; indium phosphide; indium arsenide; and/or indium antimonide, or combinations thereof. Substrate 101 may also include a semiconductor-on-insulator (SOI) substrate. In an embodiment, the substrate 101 is a silicon layer of an SOI substrate. The substrate 101 can include various doped regions depending on design requirements, e.g., n-type wells or p-type wells. The doped regions are doped with p-type dopants, e.g., boron, n-type dopants, e.g., phosphorous or arsenic, or a combination thereof. The active region 102 may include transistors. The dielectric layers 103 may include interlayer dielectric (ILD) and intermetal dielectric (IMD) layers. The ILD and IMD layers may be low-k dielectric layers which have dielectric constants (k values) smaller than a predetermined value, e.g., about 3.9, smaller than about 3.0, smaller than about 2.5 in some embodiments. In some other embodiments, the dielectric layers 103 may include non-low-k dielectric materials having dielectric constants equal to or greater than 3.9. The metal lines and vias may include copper, aluminum, nickel, tungsten, cobalt, or alloys thereof.

An Example Stacked Die Structure in Accordance with the Present Disclosure

Figure 2:
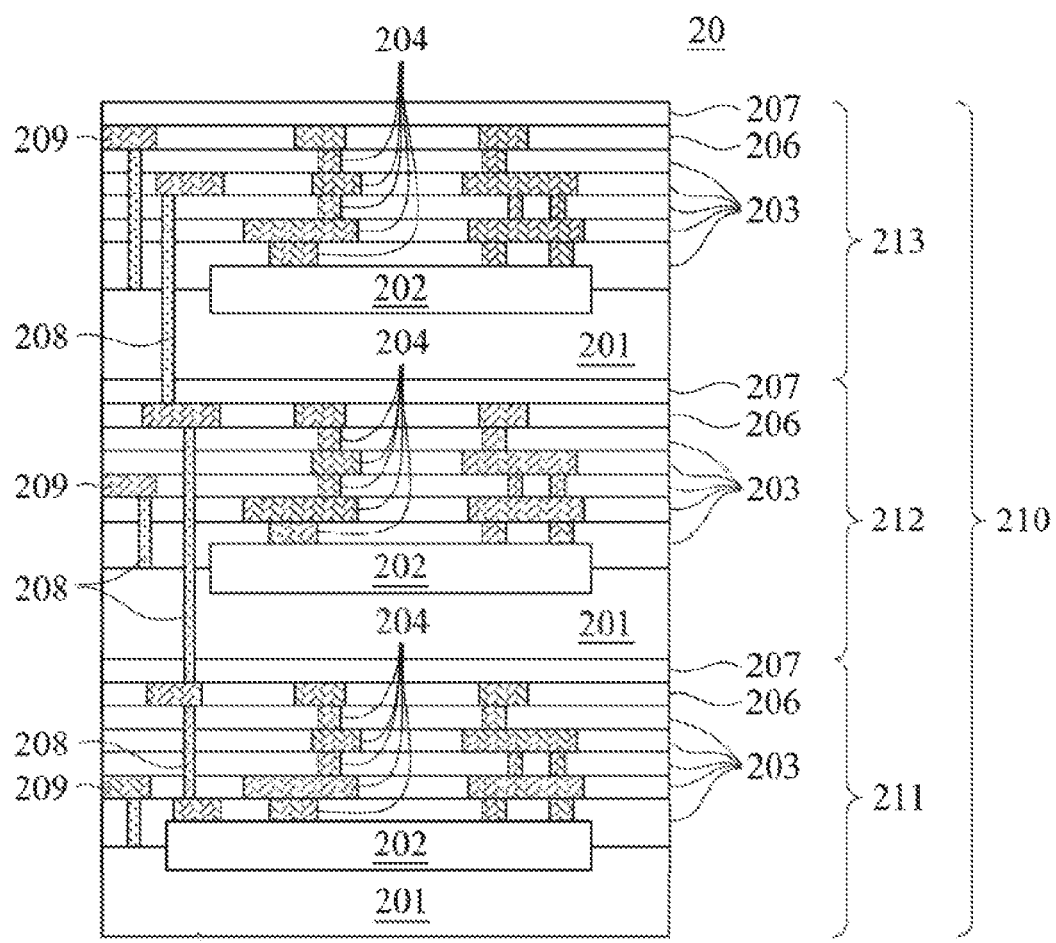
FIG. 2 is a cross-sectional view of a die group having a plurality of dies stacked on top of each other according to some embodiments.

FIG. 2 is a cross-sectional view of a die group 20 having a plurality of dies stacked on top of each other according to some embodiments. Referring to FIG. 2, the die group includes a stacked dies structure 210 including a plurality of dies stacked on top of each other in a substantially horizontal arrangement. In an embodiment, each of the dies can be a semiconductor device similar to the semiconductor device 10 of FIG. 1. For example, the stacked dies structure 210 includes stacked dies 211, 212, and 213. In an embodiment, the stacked dies are separated from each other by a passivation layer 207. Each of the stacked dies 211, 212, and 213 includes a substrate 201, an active region 202 formed on a surface of the substrate 201, a plurality of dielectric layers 203, a plurality of metal lines and a plurality of vias 204 formed in the dielectric layers 203, and a passivation layer 207 on a top intermetal layer 206. In an embodiment, a stacked die can also include passive devices, such as resistors, capacitors, diodes, inductors, and the like. The substrate 201 can be a semiconductor substrate or a non-semiconductor substrate. For example, the substrate 201 may include a bulk silicon substrate. In some embodiments, the substrate 201 may include an elementary semiconductor, such as silicon or germanium in a crystalline structure, a compound semiconductor, e.g., silicon germanium; silicon carbide; gallium arsenic; gallium phosphide; indium phosphide; indium arsenide; or combinations thereof. Possible substrate 201 may also include a semiconductor-on-insulator (SOI) substrate. In an embodiment, the substrate 201 is a silicon layer of an SOI substrate. The substrate 201 can include various doped regions depending on design requirements, e.g., n-type wells or p-type wells. The doped regions are doped with p-type dopants, e.g., boron, n-type dopants, e.g., phosphorous or arsenic, or combination thereof. The active region 202 may include transistors. The dielectric layers 203 may include interlayer dielectric (ILD) and intermetal dielectric (IMD) layers. The ILD and IMD layers may be low-k dielectric layers which have dielectric constants (k values) smaller than a predetermined value, e.g., about 3.9, smaller than about 3.0, smaller than 2.5 in some embodiments. In some other embodiments, the dielectric layers 203 may include non-low-k dielectric materials having dielectric constants equal to or greater than 3.9. The metal lines and vias may include copper, aluminum, nickel, tungsten, or alloys thereof.

The die group 20 may also include one or more through silicon vias (TSVs) or through oxide vias (TOVs) 208 configured to electrically connect one or more of the metal lines in the stacked dies 211, 212, and 213 with each other. The one or more through silicon vias or through oxide vias 208 may include copper, aluminum, tungsten, or alloys thereof. In some embodiments, each of the stacked dies 211, 212, and 213 may also include a side metal interconnect structure 209 on a sidewall of the stack dies. The side metal interconnect structure 209 may include one or more metal wirings extending through an exposed surface of the plurality of dielectric layers 203. The side metal interconnect structure 209 may be formed at the same time as the metal layers and exposed to the side surface of the die group 20 after the dies 211, 212, and 213 have been bonded together and the side surface is polished by a chemical mechanical polishing (CMP) process.

In some embodiments, the die group 20 can be formed by bonding a plurality of wafers together using fusion bonding, eutectic bonding, metal-to-metal bonding, hybrid bonding processes, and the like. A fusion bonding includes bonding an oxide layer of a wafer to an oxide layer of another wafer. In an embodiment, the oxide layer can include silicon oxide. In a eutectic bonding process, two eutectic materials are placed together, and are applied with a specific pressure and temperature to melt the eutectic materials. In the metal-to-metal bonding process, two metal pads are placed together, and a pressure and high temperature are provided to the metal pads to bond them together. In the hybrid bonding process, the metal pads of the two wafers are bonded together under high pressure and temperature, and the oxide surfaces of the two wafers are bonded at the same time.

In some embodiments, each wafer may include a plurality of dies, such as semiconductor devices of FIG. 1. The bonded wafers contain a plurality of die groups having a plurality of stacked dies. The bonded wafers are singulated by mechanical sawing, laser cutting, plasma etching, and the like to separate into individual die groups that can be the die group 20 as shown in FIG. 2.

Figure 3A:
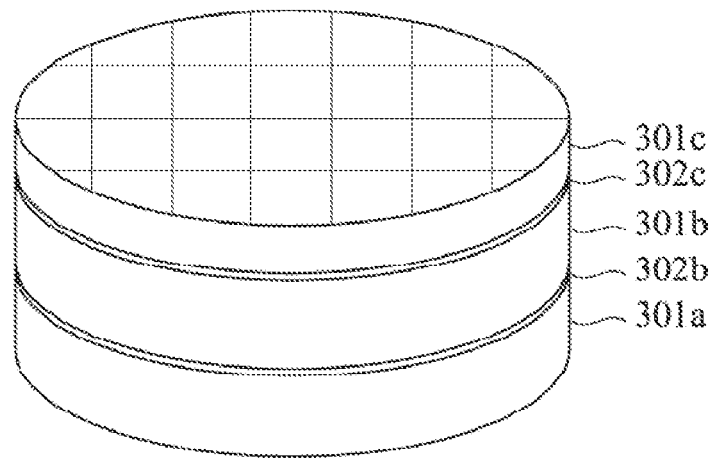
FIG. 3A is a simplified perspective view illustrating a plurality of wafers stacked on top of each other in a three-dimensional (3D) configuration according to some embodiments.

An Example Wafer on Wafer (WoW) Configuration in Accordance with the Present Disclosure FIG. 3A is a simplified perspective view illustrating a plurality of wafers stacked on top of each other in a three-dimensional (3D) configuration according to some embodiments. Referring to FIG. 3A, a first wafer 301a is a base wafer on which a plurality of dies can be formed. A second wafer 301b is an intermediate wafer on which a plurality of dies can be formed, and a third wafer 301c is a top wafer on which a plurality of dies can be formed. The wafers may have through-substrate vias and/or through-oxide vias and backside bonding layer (e.g., metallization layer and/or dielectric layer) 302b, 302c and are bonded together to form a 3D stacked wafer configuration using any known bonding techniques, e.g., fusion bonding, eutectic bonding, metal bonding, hybrid bonding, and the like. The three wafers 301a, 301b, and 301c are electrically connected to each other by through-substrate vias (TSVs), through-oxide vias (TOVs), and/or backside metallization layer and dielectric layer. The wafers each can have different dies. For example, the first wafer 301a may include dies of central processing units, graphics processing units, and logic; the second wafer 301b may include dies of memory devices and memory controllers; and the third wafer 301c may include dies of bus interfaces, input/output ports, and communication and networking devices. In the example shown in FIG. 3A, three wafers are used, but it is understood that the number is illustrative only and is chosen for describing the example embodiment and should not be limiting. In some embodiments, a passivation layer is formed on the upper surface of each of the wafers and includes a thickness to provide separation between the substrate and the metallization layer. In an embodiment, the passivation layer includes an oxide material.

Figure 3B:
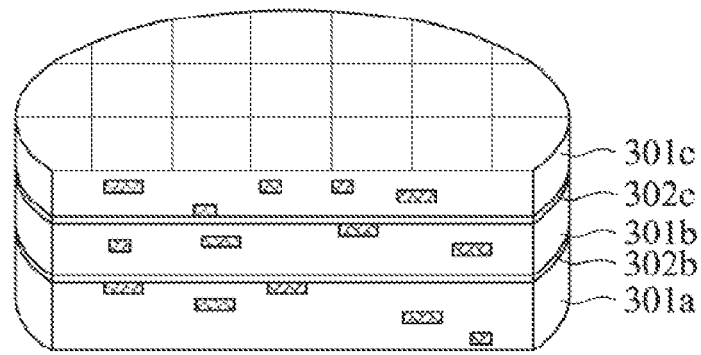
FIG. 3B is a simplified perspective view illustrating the stacked wafer configuration of FIG. 3A that has been cut and separated into individual bars according to an exemplary embodiment.
Figure 3B:
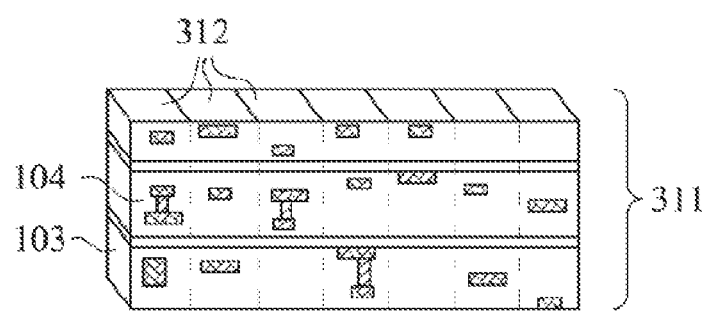

FIG. 3B is a simplified perspective view illustrating the stacked wafer configuration of FIG. 3A that has been cut and separated into individual bars according to an exemplary embodiment. For example, the stacked wafers can be cut into individual bars 311 and individual die groups 312 by mechanical sawing, plasma etching, laser cutting, and the like. Referring to FIG. 3B, each of the wafers include a substrate, a plurality of dielectric layers including interlayer dielectric layers (ILDs) and intermetal dielectric layers (IMDs), and a plurality of metal lines and a plurality of vias 104 formed in the dielectric layers 103. The dies of the stacked wafers are electrically coupled to each other by through-substrate vias and through-oxide vias. In some embodiments, the individual bars are placed on a polishing board, and the surfaces of the bars are polished prior to being diced or singulated into die groups.

Figure 3C:
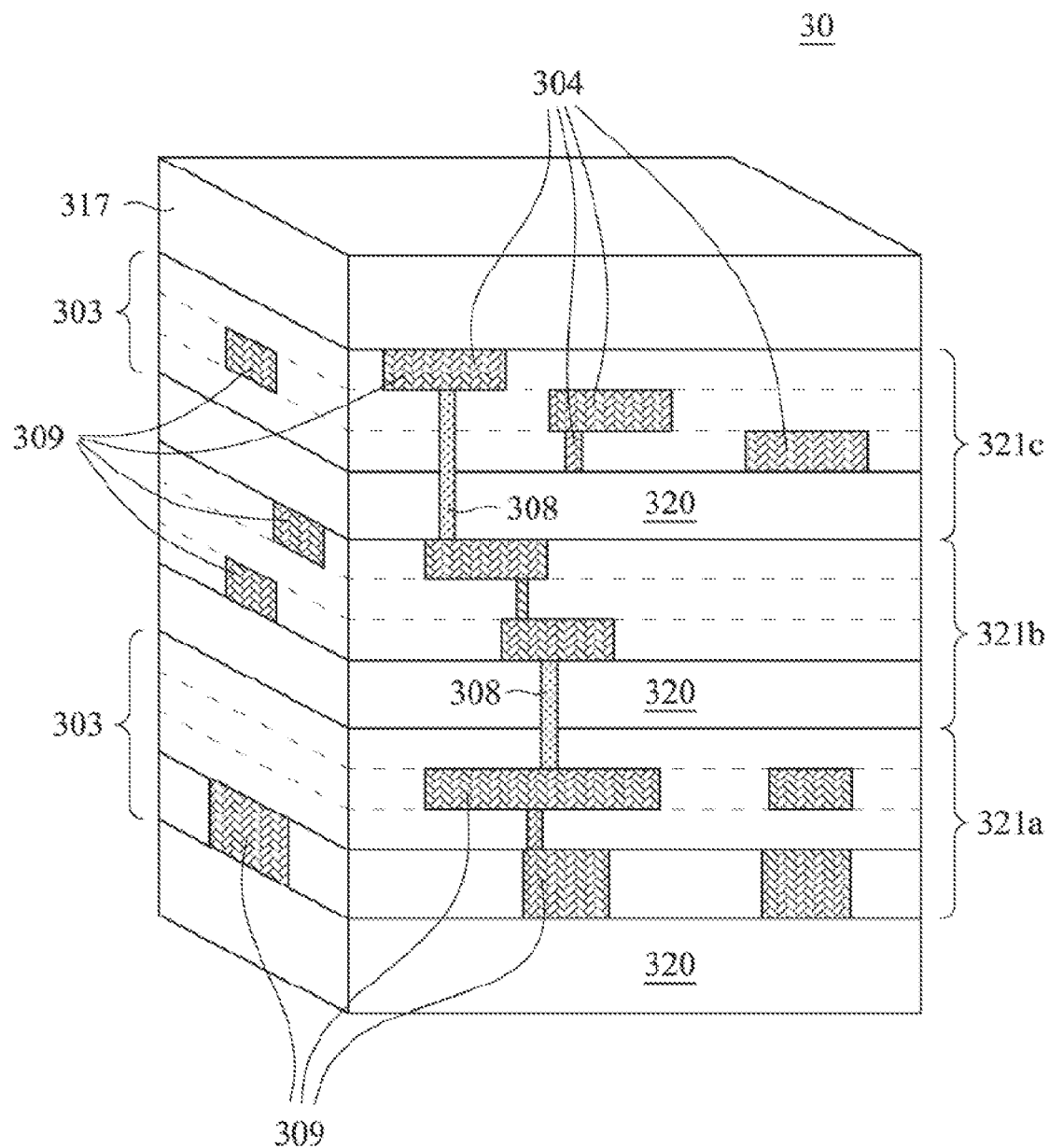
FIG. 3C is a simplified perspective view of an individual die group including a plurality of stacked dies according to an exemplary embodiment.

FIG. 3C is a simplified perspective view of an individual die group 30 including a plurality of stacked dies according to an exemplary embodiment. Referring to FIG. 3C, the die group 30 includes a first die 321a, a second die 321b, and a third die 321c stacked on top of each other. Each of the first, second, and third dies may include a substrate 320, an active region including a plurality of active devices (not shown), a plurality of dielectric layers 303, and a plurality of metal lines and vias 304 in the dielectric layers. The dies are electrically coupled to each other by through-substrate vias and through-oxide vias 308. The die group 30 further includes a metal structure 309 exposed on a side surface of the die group 30. In an embodiment, the die group 30 also includes a bonding layer 317 including an oxide material, e.g., silicon oxide. In some embodiments, the bonding layer 317 may include a plurality of bonding films. In some embodiments, the die group 30 includes a plurality of semiconductor dies or chips similar to those of FIG. 2.

Sideway Stacking of Dies in a Die Group

Attention is now directed to stacking of individual dies within a die group. In general, there may be two ways of stacking individual dies within a die group—horizontal (or co-planar) and vertical (or sideway) stacking. In co-planar stacking, individual dies are laid flat such that their substrates are faced towards (or away from) a base substrate where the die group is located. An example of a co-planar stacking of the individual dies in the die group is shown in FIG. 2. In sideway stacking, individual dies are "stood" sideway against each other in the die group such that their substrates are placed sideway with respect to the base substrate. As a conceptual illustration, thus not intended to be limiting, sideway stacking of individual dies in a die group may be visualized as standing books between two book ends on a shelf, where the books are individual dies (a bottom cover of a given one of the books may be visualized as a substrate of that book), and the shelf may be visualized as a base substrate where the die group is located. In co-planar stacking, the books are piled on top of one another on the shelf.

An Example Sideway Stacking of Dies in a Die Group

Figure 4A:
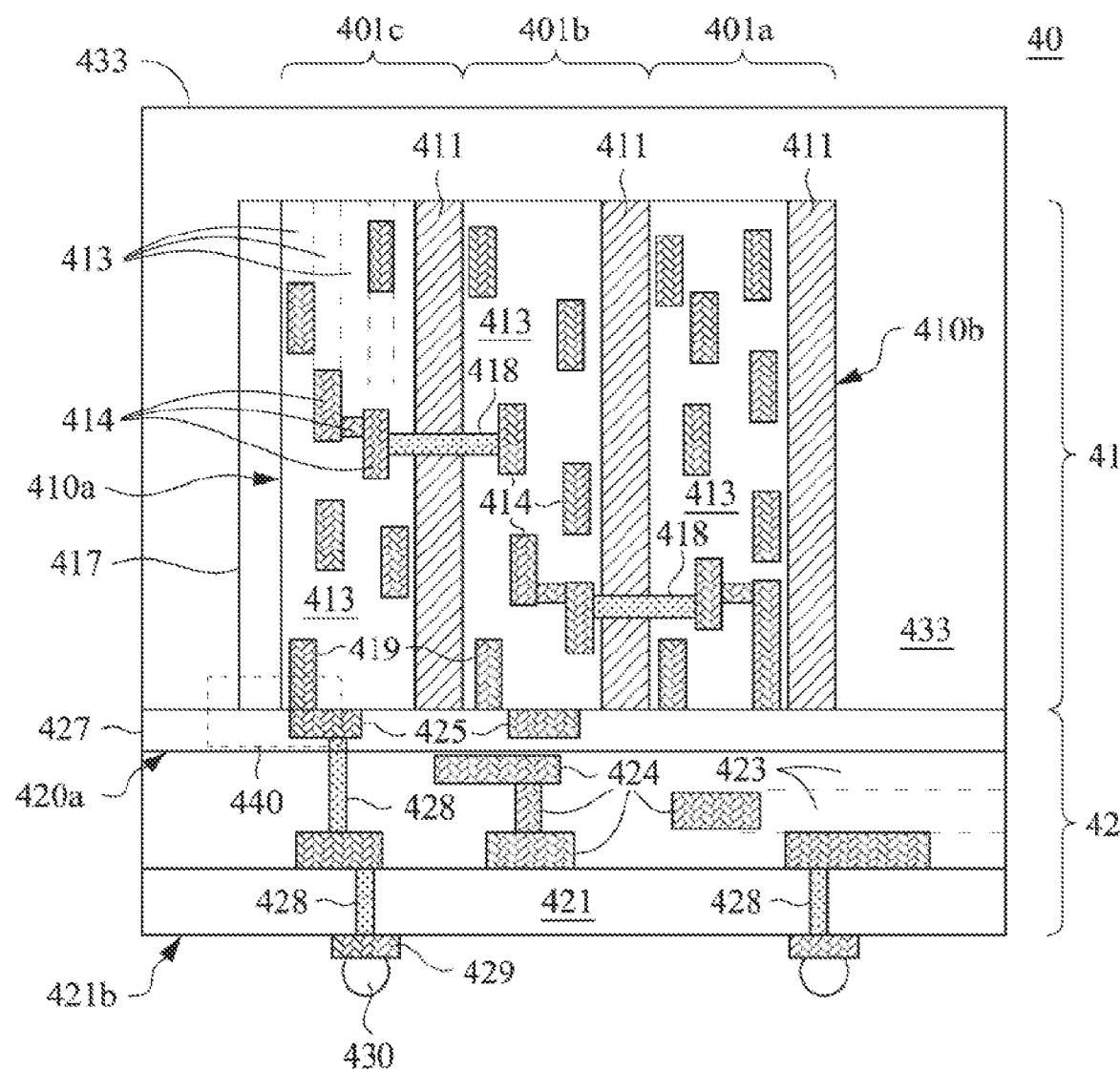
FIG. 4A is a simplified cross sectional view of a multi-die structure according to an exemplary embodiment.

FIG. 4A is a simplified cross sectional view of a multi-die structure 40 according to an exemplary embodiment. FIG. 4A illustrates an example sideway stacking of individual dies in a die group in accordance various embodiments. Referring to FIG. 4A, the multi-die structure 40 includes a first die group 41 having an upper surface 410a and a lower surface 410b, and a second die group 42 having an upper surface 420a, and the first and second die groups are disposed substantially perpendicular to each other. The first die group 41 includes a plurality of dies 401a, 401b, and 401c stacked next to each other, and each die includes a substrate 411, a plurality of dielectric layers 413, a plurality of metal lines and vias 414 in the dielectric layers 413. The dies 401a, 401b, and 401c are electrically coupled to each other by through-substrate vias and through-oxide vias 418. The first die group 41 also includes a passivation layer 417 on the upper surface 410a, and a side metal structure 419 disposed on a planar side surface of the first die group 41. The passivation layer 417 includes an oxide material. In an embodiment, the passivation layer 417 is free of a metal interconnect structure. The first die group 41 may be similar to or the same as the die group 20 of FIG. 2 or die group 30 of FIG. 3C, so that a description of which will not be repeated herein for the sake of brevity.

The second die group 42 includes a substrate 421, a plurality of dielectric layers 423, a plurality of metal lines and vias 424 in the dielectric layers 423, a passivation layer 427 on an upper surface 420a of the second die group 42. The passivation layer 427 includes an oxide material. In an embodiment, the passivation layer 427 may be a hybrid passivation layer having a plurality of metal pads 425 in the oxide material and electrically separated from each other by the passivation layer. The second die group 42 also includes one or more through-silicon vias and through-oxide vias 428 electrically coupled to the metal structure 419 either directly or through the metal pad 425. In an embodiment, the second die group 42 does not include active devices (e.g., transistors) or passive devices (resistors, diodes, inductors). In an embodiment, the substrate 421 can include active and/or passive devices formed therein. The substrate 421 can include doped or undoped silicon, an active layer of a semiconductor-on-insulator (SOI) substrate or other semiconductor materials, e.g., germanium; a compound semiconductor including silicon carbide; gallium arsenic; gallium phosphide; indium phosphide; indium arsenide; an alloy semiconductor including SiGe, GaAsP, AlGaAs, GaTnAs, GaInP; or combinations thereof. Other substrates, such as multi-layered or gradient substrates, may also be used. In an embodiment, devices, such as transistors, diodes, capacitors, resistors, may be formed in the substrate and may be interconnected by interconnect structures by metallization patterns in one or more dielectric layers 423. In the example shown in FIG. 4A, a single substrate 421 is used for the second die group 42, but it is understood that the number is illustrative only and is chosen for describing the example embodiment and should not be limiting. That is, the second die group 42 can include a stack of dies stacked on top of each other in some embodiments.

The first die group 41 is attached to the second die group 42 with the first and second passivation layers 417, 427 and/or by the side metal structure 419 and metal pads 425 in the hybrid passivation layer 427. In some embodiments, the first die group 41 and the second die group 42 are bonded by fusion bonding, direct bonding, dielectric bonding, metal bonding, hybrid bonding, or the like. In the fusion bonding, the oxide surfaces of the passivation layers 417, 427 are bonded together. In the metal bonding, a metal surface of the side metal structure 419 and a metal surface of the metal pads 425 are pressed against each other at an elevated temperature, the metal inter-diffusion causing the bonding of the side metal structure 419 and the metal pads 425. In the hybrid bonding, the metal surface of the side metal structure 419 and the metal surface of the metal pads 425 are bonded together and the oxide surfaces of the passivation layers 417, 427 are bonded together. In some embodiments, the second die group 42 is a base die group or bottom die group configured to provide mechanical support and electrical wirings to the attached first die group 41. The first die group 41 is referred to as a top die group, and the second die group 42 is referred to as a bottom die group. In some embodiments, the second die group 42 may have a plurality of bond pads 429 on a lower surface 421b of the substrate 421, each bond pad being electrically coupled to an under metal bump or micro bump 430 that is configured to provide electrical connection to external circuitry through a printed circuit board (PCB), interposer, or the like. In an embodiment, the metal pads 425 have a surface coplanar with an upper surface of the passivation layer 427. In some embodiments, the multi-die structure 40 also includes an around die dielectric 433 layer encapsulating the first die group 41 and the second die group 42 after they are bonded together. In an embodiment, the around die dielectric 433 includes tetraethyl orthosilicate (TEOS), silicon oxide, and the like.

Figure 4B:
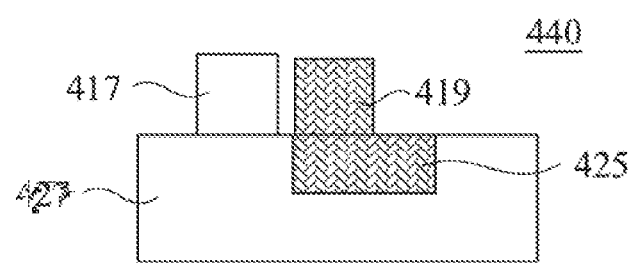
FIG. 4B is a cross-sectional view of an enlarged portion of the multi-die structure of FIG. 4A

FIG. 4B is a cross-sectional view of an enlarged portion (indicated by a dotted-line rectangle) 440 of the multi-die structure 40 of FIG. 4A. Referring to FIG. 4B, oxide surfaces of the first passivation layer 417 and second passivation layer 427 are fusion bonded together. The passivation layers 417 and 427 each include an oxide material and function as bonding layers. In an embodiment, the metal structure 419 and the metal pad 425 are metal-to-metal bonded together. In an embodiment, each of the metal structure 419 and the metal pad 425 may include copper for a copper-to-copper bonding. In an embodiment, each of the metal structure 419 and the metal pad 425 may include aluminum for an aluminum-to-aluminum bonding. In an embodiment, each of the metal structure 419 and the metal pad 425 may include tin or tin alloy for a tin-to-tin or tin alloy bonding. In an embodiment, the metal structure 419 and the metal pad 425 function as interconnect layers. In an embodiment, the metal structure 419 and the metal pad 425 function as bonding layers, rather than interconnect layers. In an embodiment, the metal structure 419 and the metal pad 425 function as thermal dissipation layers to mitigate hot spots in the die group. In an embodiment, the metal structure 419 and the metal pad 425 are connected to a grounding plane for electromagnetic shielding of some functional devices of the die group. In an embodiment, the metal structure 419 and the metal pad 425 can have more than one of the functions described above. In an embodiment, the metal pad 425 may include a micro metal bump or a solder bump. The metal pads have a coefficient of thermal expansion (CTE) higher than that of the passivation layers (i.e., oxide bonding layers). The different CTEs can cause problems in bonding the passivation layers, such as warpage and breakage (chip cracking) of the second die group 42.

Examples of Die Group Structure

Figure 5A:
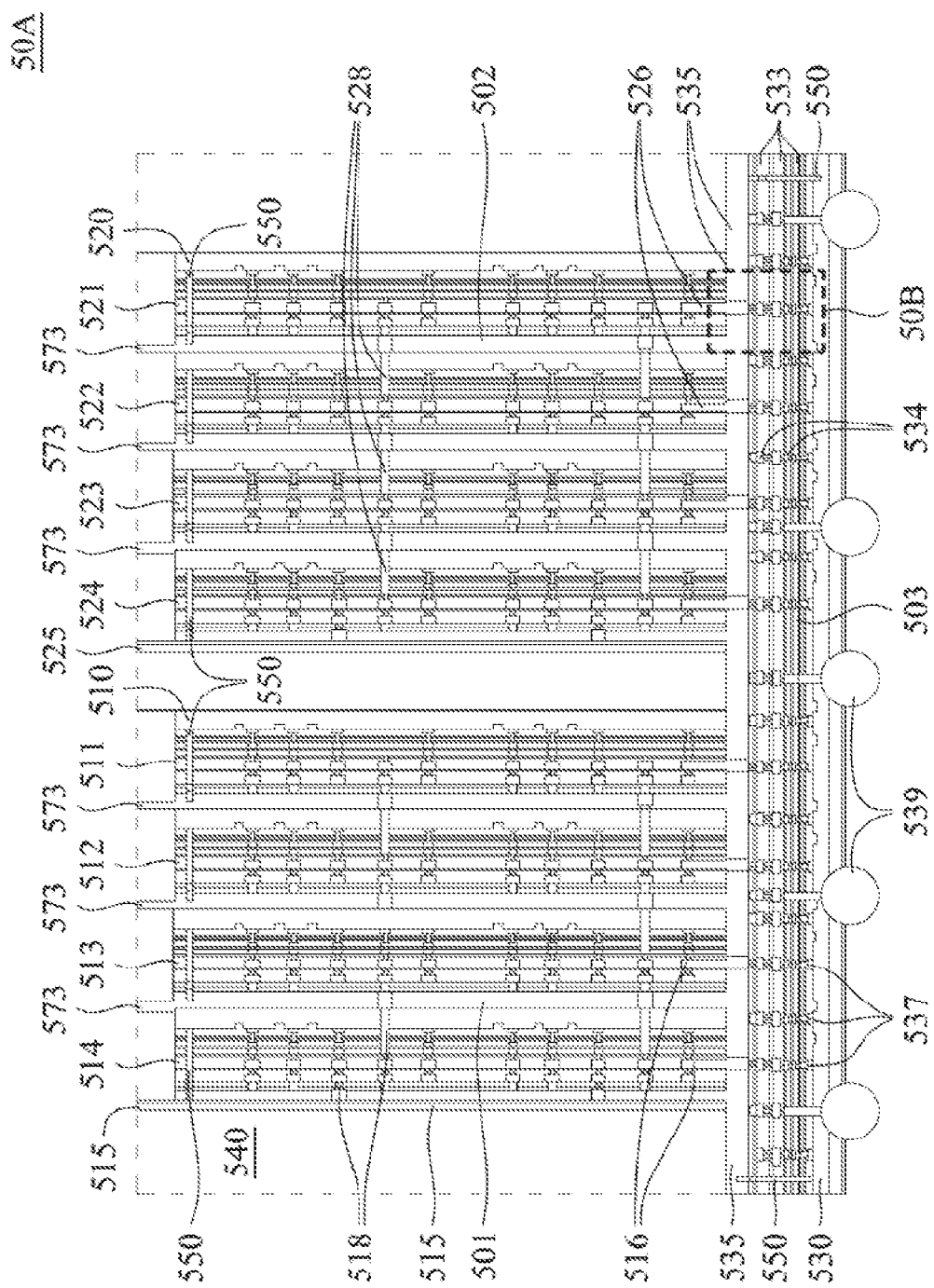
FIG. 5A is a cross-sectional view of a three-dimensional (3D) die group structure according to some embodiments.
Figure 5B:
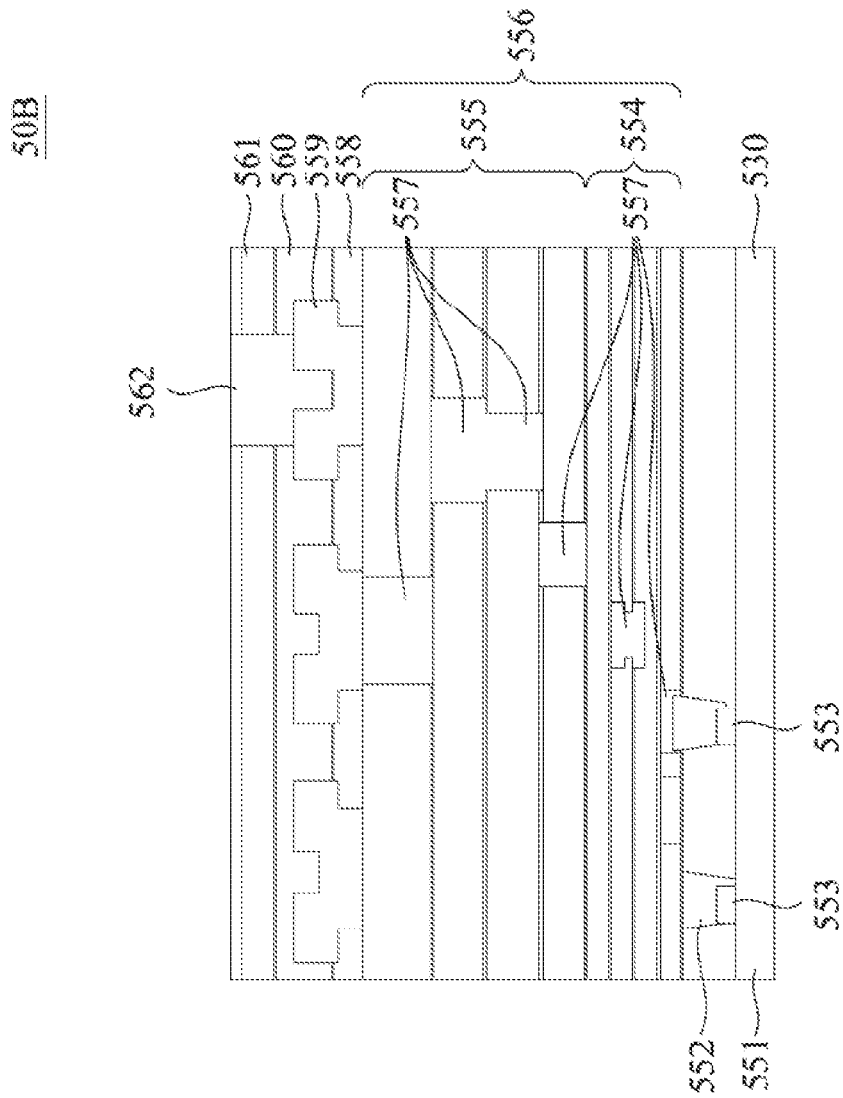
FIG. 5B is an enlarged cross-sectional view of a portion of the 3D die group structure of FIG. 5A.
Figure 5C:
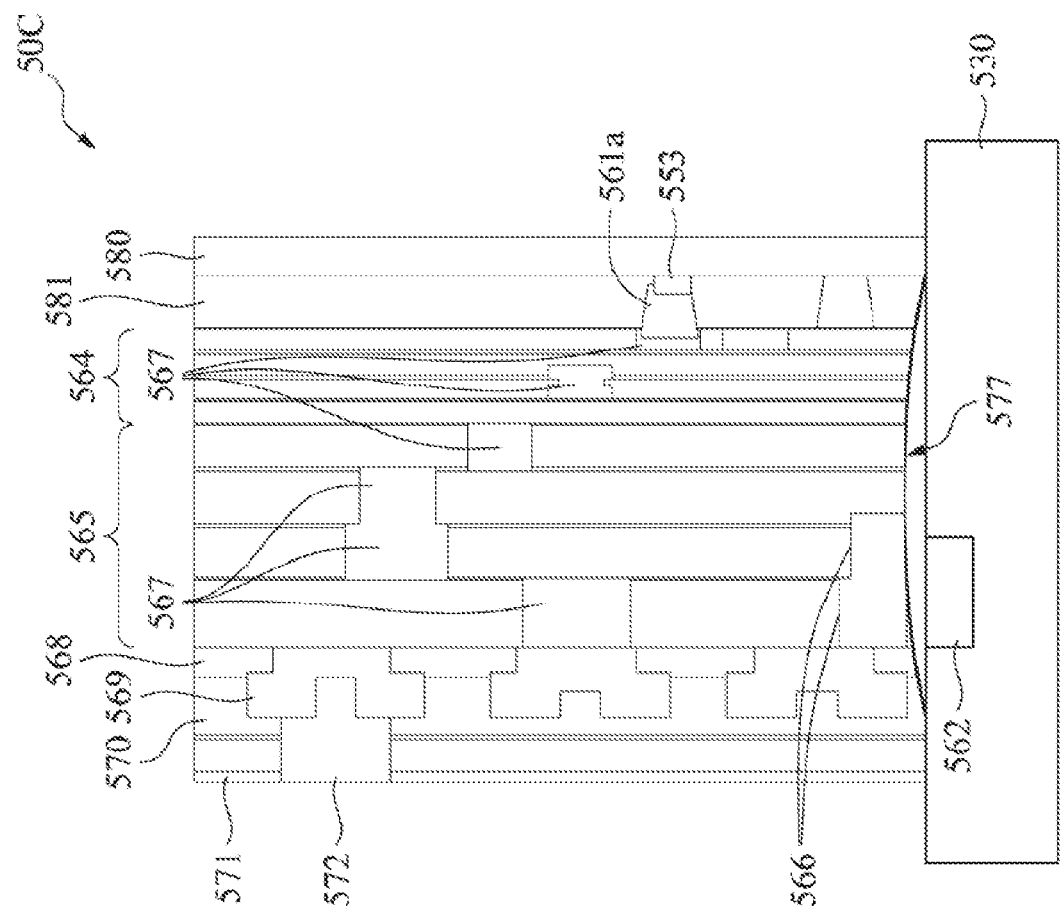
FIG. 5C is a cross-sectional view illustrating a side surface of a semiconductor device suffering a dishing effect after planarization according to some embodiments.
Figure 5D:
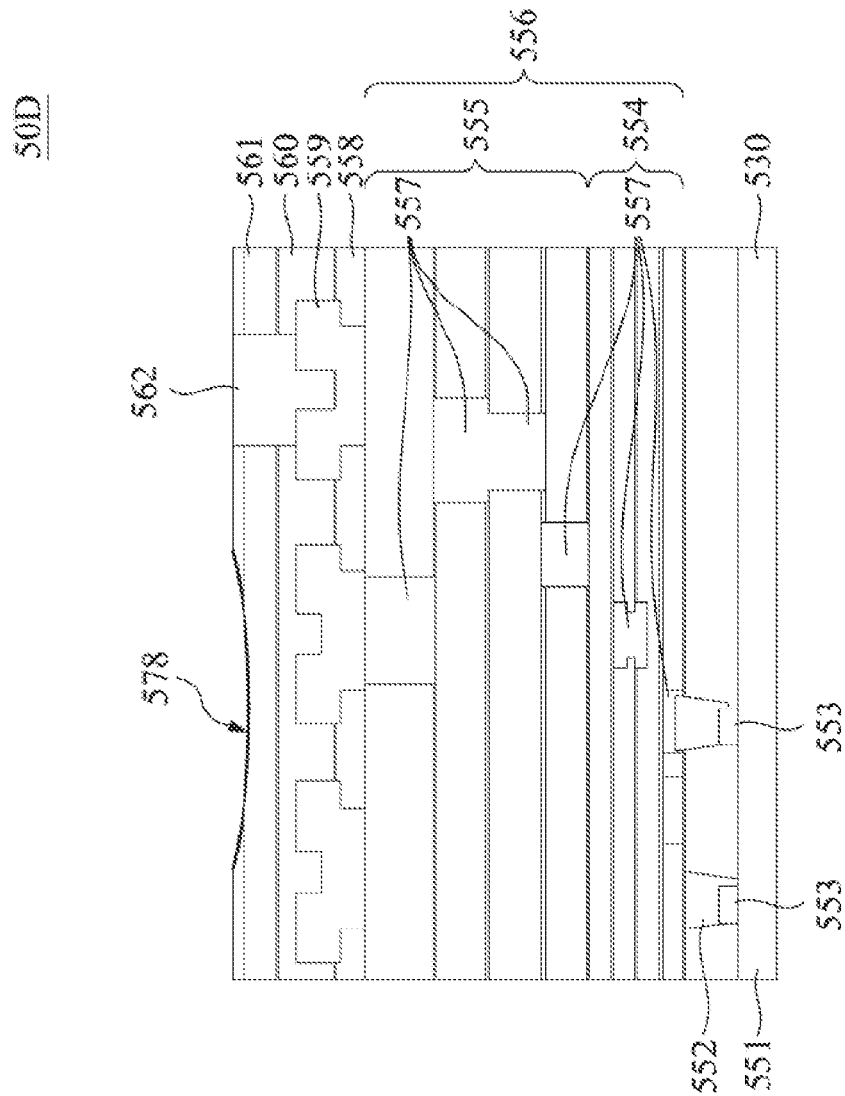
FIG. 5D is a cross-sectional view illustrating an upper surface of a semiconductor device suffering a dishing effect after planarization according to some embodiments.
Figure 6:
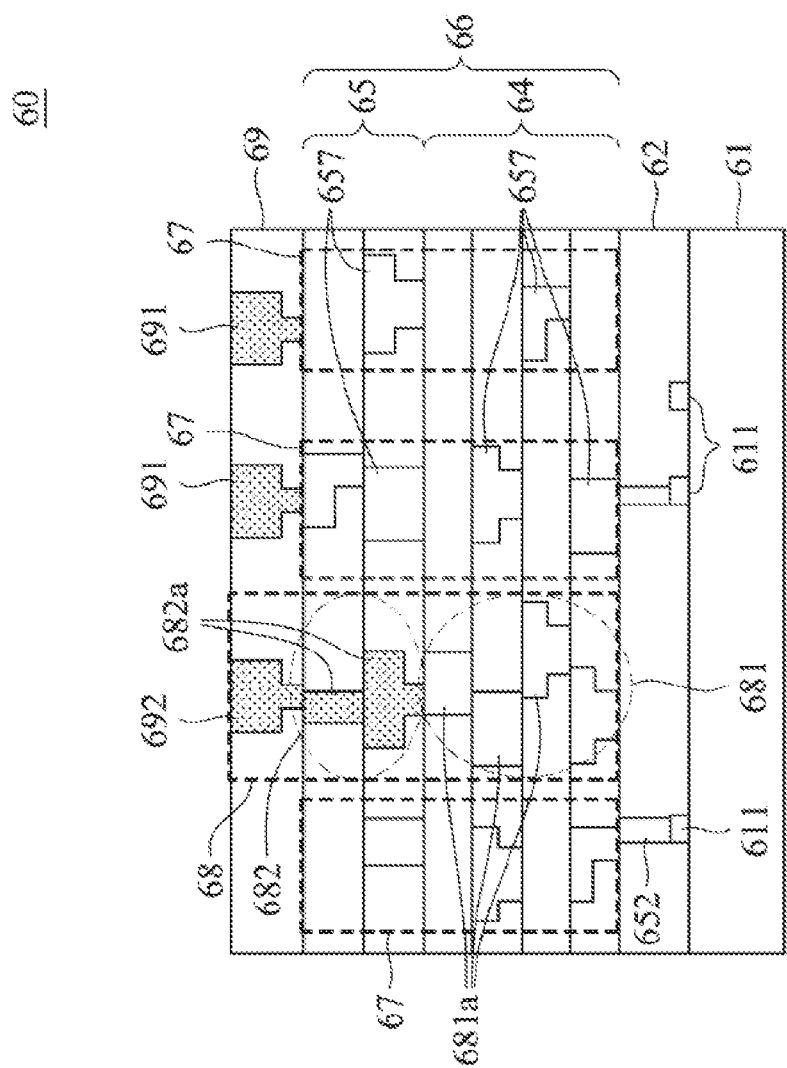
FIG. 6 is a cross-sectional view illustrating a semiconductor device including a dummy pattern structure in an intermetal dielectric layer structure according to some embodiments.

Attention is now directed to FIGS. 5A-6, where two examples of die group structures are shown to illustrate multi-die-group structures of interest to the present disclosure. They will be described with reference to FIGS. 1-4B.

FIG. 5A is a cross-sectional view of an example three-dimensional (3D) die group structure 50A. Referring to FIG. 5A, the 3D die group structure 50A includes a first die group 501, a second die group 502, and a third die group 503. Each of the first and second die groups 501, 502 may include a plurality of dies stacked on one another with a bonding film 573. For example, the first die group includes a base die 511, a first intermediate die 512 on the base die 511, a second intermediate die 513 on the first intermediate die 512, and a top die 514 on the second intermediate die 513. Each of the base die 511, second and third dies 512 and 513, and the top die 514 includes a substrate 510, a plurality dielectric layers, and a plurality of metal lines and vias in the dielectric layers, similar to the semiconductor device 10 of FIG. 1. The base die 511, second and third dies 512 and 513, and the top die 514 are stacked on top of each other to form the first die group 501, and a plurality of through-substrate vias (TSVs) and through-oxide vias (TOVs) 518 provide electrical connections between the stacked dies, similar to the die group 20 of FIG. 2 or die group 30 of FIG. 3C. Similarly, the second die group 502 includes a base die 521, a first intermediate die 522 on the base die 521, a second intermediate die 523 on the first intermediate die 522, and a top die 524 on the second intermediate die 523. Each of the base die 521, second and third dies 522 and 523, and the top die 524 includes a substrate 520, a plurality dielectric layers, and a plurality of metal lines and vias on the dielectric layers, similar to the semiconductor device 10 of FIG. 1. The base die 521, second and third dies 522 and 523, and the top die 524 are stacked on top of each other to form the second die group 502, and a plurality of through-substrate vias and through-oxide vias 528 provide electrical connections between the stacked dies, similar to the die group 20 of FIG. 2 or die group 30 of FIG. 3C. The first and second die groups can have the same functions or different functions. For example, the first die group may include one or more central processing units, graphics processing units, and network interconnection units that can be electrically coupled to each other using through-substrate vias (TSVs) or through oxide vias (TOVs), and the second die group may include one or more memory units configured to store data that are read by the processing units of the first die group. Each of the first and second die groups includes a bonding member (515, 525) on the surface of the top die. In an embodiment, the bonding member includes one or more dielectric layers including an oxide material (e.g., silicon oxide). In an embodiment, the bonding member (515, 525) can be free of a metal interconnection structure. For example, the first die group includes the bonding member 515 disposed on the upper surface of the top die 514 and free of a metal interconnect structure, and the second die group includes a bonding member 525 disposed on the upper surface of the top die 524 and free of a metal interconnect structure. In an embodiment, the first die group also includes a metal connection member 516 on a planar side surface of the first die group, and the second die group also includes a metal connection member 526 on a planar side surface of the second die group.

In an embodiment, the third die group 503 functions as a support substrate, a carrier substrate, or an interposer and has a dimension greater than a total dimension of the first and second die groups. In an exemplary embodiment, the third die group includes a substrate 530 and wirings configured to provide electrical connections between the first and second die groups. In an embodiment, the third die group also includes a plurality of active devices 537 on the substrate, a plurality of dielectric layers 533 on the active devices, and a plurality of metal lines and vias 534 in the dielectric layers 533. The third die group also includes a bonding member 535 having a planar surface configured to bond with the bonding layers 515 and 525 of the first and second die groups. In an embodiment, the bonding member 535 is a hybrid bonding member including an oxide material (e.g., silicon oxide) and a plurality of bond pads in the oxide material and configured to couple to the metal connection members 516 and 526 of the first and second die groups, respectively. In an embodiment, the third die group also includes a plurality of under metal bumps or micro bumps 539 on its lower surface. In an embodiment, the 3D die group structure 50A also includes an around die dielectric layer 540 overlying the first, second and third die group after the first and second die groups have been mounted or bonded to the third die group. The around die dielectric layer 540 includes TEOS or silicon oxide. In an embodiment, the first, second, and third die groups also include a seal ring structure 550 configured to prevent moisture and contaminants from entering the die groups.

In some embodiments, the first die group and the second die group each is formed by bonding a plurality of wafers on top of each other, and a cutting process (plasma etch, mechanical sawing, laser cutting) is performed on the bonded wafers to separate the bonded wafers into individual bars; the bars are then polished and singulated to individual die groups. In an embodiment, the singulation process may be performed by mechanical sawing. In an embodiment, the singulation process may be performed using suitable techniques, e.g., plasma etching, laser cutting, to prevent cracking and chipping.

Referring to FIG. 5A, as can be seen, compared with the die group 20 shown in FIG. 2, each of the first die group 501 and the second die group 502 is stacked sideway as mentioned above so that the bonding members 515 and 525 are vertically (perpendicularly) disposed on an upper surface (main surface) of the bonding member 535 of the third die group 503 through a side (edge) surface of the respective bonding members 515 and 525. Each of the first and second die groups is electrically coupled to the third die group through the respective connection members 516 and 526. In an embodiment, the connection member is the side metal interconnect structure 209 of FIG. 2 or the side metal structure 419 of FIGS. 4A and 4B. In an embodiment, the third die group may have one or more dies stacked on top of each other. The one or more dies of the third die group can be electrically connected to another circuitry on a printed circuit board (not shown) through the plurality of under metal bumps or micro bumps 539. In the example shown in FIG. 5A, the first die group and the second die group each includes four dies stacked parallel to each other, but it is to be understood that the number is illustrative only and should not be limiting. In other words, the first die group and the second die group can have a same number of dies or different number of dies arranged parallel to each other. Those skilled in the art will appreciate that the parallel stacked dies in each of the first and second die groups are aligned to a planar side surface of the associate die group, and that an edge surface of the bonding member 515 is flush with the planar side surface of the first die group 501 and an edge surface 525*a* of the bonding member 525 is flush with the planar side surface of the second die group 502 in order to provide good mechanical stability under thermal stress after mounting on the surface of the bonding member 535 of the third die group 503. In the embodiment shown, two top die groups 501, 502 are perpendicularly mounted on the base die group 503; it is to be understood that the number is illustrative only and should not be limiting. In some embodiments, fewer or more than two top die groups, e.g., one or three, four, five, six top die groups can be mounted on the base die group 503.

Dishing and Erosion Caused by a CMP Process

In this section, side effects associated with fabricating the die-group structure 50A, such as dishing and erosion effects, are described and illustrated. These effects will be described and illustrated using FIGS. 5B-5D. In FIG. 5B, a CMP process in fabricating the die-group structure 50A is provided. In FIG. 5C, dishing and erosion effects to any one of dies in the die groups 501 or 502 are described and illustrated.

FIG. 5B is an example of a portion 50B (indicated by a dotted-line rectangle in FIG. 5A) of the 3D die group structure of FIG. 5A with further details. Referring to FIG. 5B, in this example, the portion 50B includes a front-end-of-line (FEOL) representing a first portion of the fabrication of an integrated circuit (die), where individual devices (e.g., transistors, capacitors, diodes, resistors, inductors, and the like) are formed in and on a semiconductor substrate. An FEOL may include defining active regions in upper surface portions of the semiconductor substrate, forming trench isolation structures isolating the individual devices, performing implants for well formation, forming gate structure and source and drain regions. The portion 50B also includes a back-end-of-line (BEOL) representing a second portion of the fabrication of the die after the FEOL. A BEOL includes forming metal and via patterns based on positions of the formed individual devices. For example, an interlayer dielectric layer (ILD) 551 is first deposited on the substrate 530, with a pattern of metal and via layers subsequently patterned therein. The interlayer dielectric layer 551 may include a dielectric or insulating material. Examples of suitable dielectric materials include silicon oxide, doped silicon oxide, various low-k dielectric and high-k dielectric materials known in the art, and combinations thereof. The interlayer dielectric layer 551 may include a plurality of dielectric layers and be formed by conventional techniques, such as, chemical vapor deposition (CVD), plasma enhanced CVD (PECVD), and physical vapor deposition (PVD), or by other deposition methods. Vias 552 are formed through the ILD 551 to provide an electrical connection to devices 553. In an embodiment, the vias 552 include tungsten (W) or copper.

A plurality of intermetal dielectric (IMD) layers 556 are formed over the ILD 551. In an embodiment, the IMD layers 556 may include a plurality of extremely low-k dielectric layers 554 formed over the ILD 551 and a plurality of low-k dielectric layers 555 over the plurality of extremely low-k dielectric layers 554. The extremely low-k dielectric layers 554 includes extremely low-k dielectric material, such as porous carbon doped silicon dioxide, a polymer, e.g., polyimide, the like, or a combination thereof, having a dielectric constant smaller than about 3.5, smaller than about 3.0, and smaller than about 2.5. The low-k dielectric layers 555 include a low-k dielectric material, such as carbon doped oxide, un-doped silicate glass (USG), fluorinated silicate glass (FSG), the like, or a combination thereof, having a dielectric constant lower than 3.9. A plurality of metal and via layers 557 are formed in the IMD layers 556.

In an embodiment, the metal and via layers 557 include one or more metal or other conductive structures. The conductive structures include interconnect lines containing multiple metal materials. The term metal or metal material can include alloys, stacks, and combinations of multiple metals. For example, the interconnect lines can include copper, aluminum, tungsten, silver, gold, platinum, and alloys thereof. A passivation layer 558 is formed over an upper surface of the IMD layers 556. A plurality of interconnect pads 559 are formed on the passivation layer 558 and electrically connecting to the metal and via layers 557. The interconnect pads 559 can include a metal material, such as aluminum, copper, tungsten silver, gold, platinum, or alloys thereof. A die dielectric layer 560 is formed on the interconnect pads 559. A bonding layer 561 is formed on the die dielectric layer 560. A contact 562, e.g., formed of Cu, W, CuSn, AuSn, InAu, PbSn, and/or any other suitable materials, is formed in the bonding layer 561 and in electrical contact with the interconnect pads 559. In an embodiment, the contact 562 may be formed on the bonding layer 561 by depositing a metal contact layer using chemical vapor deposition (CVD), physical vapor deposition (PVD), and other suitable deposition processes. In an embodiment, a chemical mechanical polishing (CMP) process is used for removing excess metal to planarize the metal contact layer to obtain the contact 562.

The aforementioned CMP process involves using a polishing pad to planarize the metal contact layer so that the upper surface of the contact 562 is flush with the upper surface of the bonding layer 561. In an embodiment, the planarized bonding layer 561 and the contact 562 having a surface substantially flush with the planar upper surface of the bonding layer 561 form the bonding member 535. However, the underlying IMD layers 556 with the extremely low-k dielectric layers 554 (materials with high porosity) and having low density in metal and via layers 557 may suffer dishing and/or erosion effects caused by the CMP process (e.g., uneven polish rate during the CMP process). For example, it is observed that a concave shape can be formed on the upper surface of the bonding layer 561 after the CMP process.

FIG. 5C is a cross-sectional view illustrating a side surface of a semiconductor device 50C suffering dishing effect after planarization according to some embodiments. The semiconductor device 50C can be any of the dies 511, 512, 513 or 514 of the first die group 501, or the die 521, 522, 523, or 524 of the second die group 502. Referring to FIG. 5C, a dielectric layer 581 is formed on a substrate 580, a plurality of extremely low-k dielectric layers 564 are formed on the dielectric layer 561, a plurality of low-k dielectric layers 565 are formed on the extremely low-k dielectric layers 564, and active devices 553 on the substrate 580 are connected to metal lines and vias 567 through contacts and trenches 561a filled with a conductive material, In an embodiment, a passivation layer 568 is formed over an upper surface of the IMD layers 566. A plurality of interconnect pads 569 are formed on the passivation layer 568 and electrically connected to the metal and via layers 567. The interconnect pads 569 can include a metal material, such as aluminum, copper, tungsten silver, gold, platinum, or alloys thereof. A die dielectric layer 570 is formed on the interconnect pads 569. A bonding layer 571 is formed on the die dielectric layer 570. A contact 572, e.g., formed of Cu, W, CuSn, AuSn, InAu, PbSn, or the like, is formed in the bonding layer 571 and in electrical contact with the interconnect pads 569. In an embodiment, the contact 572 may be formed on the bonding layer 571 by depositing a metal contact layer using chemical vapor deposition (CVD), physical vapor deposition (PVD), and other suitable deposition processes. In an embodiment, a chemical mechanical polishing (CMP) process is used for planarizing the metal contact layer to obtain the contact 572. In an embodiment, the semiconductor device 50C can be bonded to a next die using the bonding layer 571 and contact 572 to form a stacked die group (e.g., first or second die group 501, 502).

In some embodiments, the different dielectric layers of the side surface of the semiconductor device 50C have different polish rates and suffer from dishing effect 577 after planarization. Each of the dielectric layers experiences some material loss when grinding by a rotating polishing pad. The dishing effect causes the surface to have a concave shape which is detrimental for bonding the semiconductor device 50C to a carrier substrate (e.g., the third die group 503). For example, the concave surface of the semiconductor device 50C does not provide a good contact between the metal structure 566 and a metal pad 562 in the carrier substrate.

FIG. 5D is a cross-sectional view illustrating an upper surface of a semiconductor device 50D suffering a dishing effect after planarization according to some embodiments. Referring to FIG. 5D, dishing effect 578 may occur when a polishing process is performed on the bonding layer 561 and the contact 562 because they have different polishing rates due to the different materials.

Dummy Pattern for Reducing Dishing and Erosion

Having described various side effects associated with fabricating a die-group structure in accordance with the disclosure, this section describes novel techniques for addressing such effects.

FIG. 6 is a cross-sectional view illustrating a semiconductor device 60 having a dummy pattern structure in an intermetal dielectric layer structure according to some embodiments for addressing some of the side effects associated with fabricating a die group structure in accordance with the disclosure. Referring to FIG. 6, the semiconductor device 60 includes a substrate 61 having a plurality of devices (e.g., transistors, resistors, capacitor, and the like) 611 formed thereon, an interlayer dielectric (ILD) layer 62 on the substrate 61, an intermetal dielectric layer (IMD) structure 66 on the ILD layer 62, and a passivation layer 69 on the IMD structure 66. In an embodiment, the IMD structure 66 includes one or more extremely low-k dielectric layers 64 having a first dielectric constant value and one or more low-k dielectric layers 65 on the one or more extremely low-k dielectric layers 64 having a second dielectric constant value that is greater than the first dielectric constant value. In an embodiment, the IMD structure 66 is similar to the structure 556 of FIG. 5B. The semiconductor device 60 also includes a plurality of active structures 67 containing a plurality of metal lines and vias 657 in the IMD structure 66. An active structure refers to a multi-layered structure that includes one or more metal lines and vias that are electrically connected to one or more devices in the substrate 61 through one or more vias 652, therefore, the active structure performs electrical circuit functions. The semiconductor device 60 further includes a dummy pattern structure 68 interposed between two or more adjacent active structures 67.

In an embodiment, the dummy pattern structure 68 includes a first dummy conductive pattern 681 in the one or more extremely low-k dielectric layers 64 and a second dummy conductive pattern 682 in the one or more low-k dielectric layers 65. The first dummy conductive pattern 681 includes a plurality of first dummy metal lines and dummy vias 681a having a first dummy pattern density, and the second dummy conductive pattern 682 includes a plurality of second dummy metal lines and dummy vias 682a having a second dummy pattern density. The dummy metal lines and dummy vias refers to metal interconnects that can be connected to a power supply, to ground, or in a floating state, and do not have any function with respect to electric circuit functions, i.e., the first dummy conductive pattern 681 and the second dummy conductive pattern 682 are not connected to devices on the substrate 61.

The semiconductor device 60 further includes a plurality of interconnect pads 691 in the passivation layer 69 and electrically coupled to the active structures 67. In an embodiment, the dummy pattern structure 68 also includes a plurality of bonding pads 692 in the passivation layer 69 and coupled to the second dummy metal lines and dummy vias 682a in the one or more low-k dielectric layers 65. In an embodiment, the interconnect pads 691 and the bonding pads 692 correspond to the metal pads 425 of the second die group 42 of FIGS. 4A and 4B. In an embodiment, the pattern density of the interconnect pads 691 and the bonding pads 692 is in a range between about +/−50 percent of the pattern density of the metal lines and vias 657 of the active structures 67 in the IMD structure 66, i.e., the pattern density of the interconnect pads 691 and the bonding pads 692 is 50 percent, 80 percent, 100 percent, 130 percent, or 150 percent of the pattern density of the metal lines and vias 657 of the active structures 67 in the IMD structure 66. As defined herein, the term "pattern density" refers to the number of conductive elements (e.g., metal lines, vias) in a given area or volume of one or more dielectric layers. The term "pattern density" also refers to the area or volume of conductive elements divided by the respective non-conductive pattern area or volume, i.e., a ratio of area or volume of conductive elements to respective non-conductive pattern area or volume. Conductive elements may include, but are not limited to, chromium, copper, cobalt, aluminum, titanium, tungsten, silver, gold, and the like. The non-conductive pattern area or volume is the associated region of the dielectric layers.

In an embodiment, the first dummy pattern density of the plurality of first dummy metal lines and dummy vias 681a in the extremely low-k dielectric layers 64 is equal to or greater than the second dummy pattern density of the plurality of second dummy metal lines and dummy vias 682a in the low-k dielectric layers 65. By having the first dummy pattern density of the first dummy metal lines and dummy vias 681a in the extremely low-k dielectric layers 64 equal to or greater than the second dummy pattern density of the second dummy metal lines and dummy vias 682a in the low-k dielectric layers 65, the phenomenon of dishing and erosion effects can be reduced or eliminated in the planarization process.

With the insertion of a dummy pattern structure 68 between two or more adjacent active structures 67 in the intermetal layer structure, the conductive pattern density in the intermetal dielectric layer is increased. As a result, the dishing effect of a chemical mechanical polishing is reduced. The dummy pattern structure can be added to a die in a top die group, to a die in a bottom die group, or to both the top die group and the bottom die group when a planarization to a surface of the die or the die group has to be performed according to some embodiments.

Figure 7:
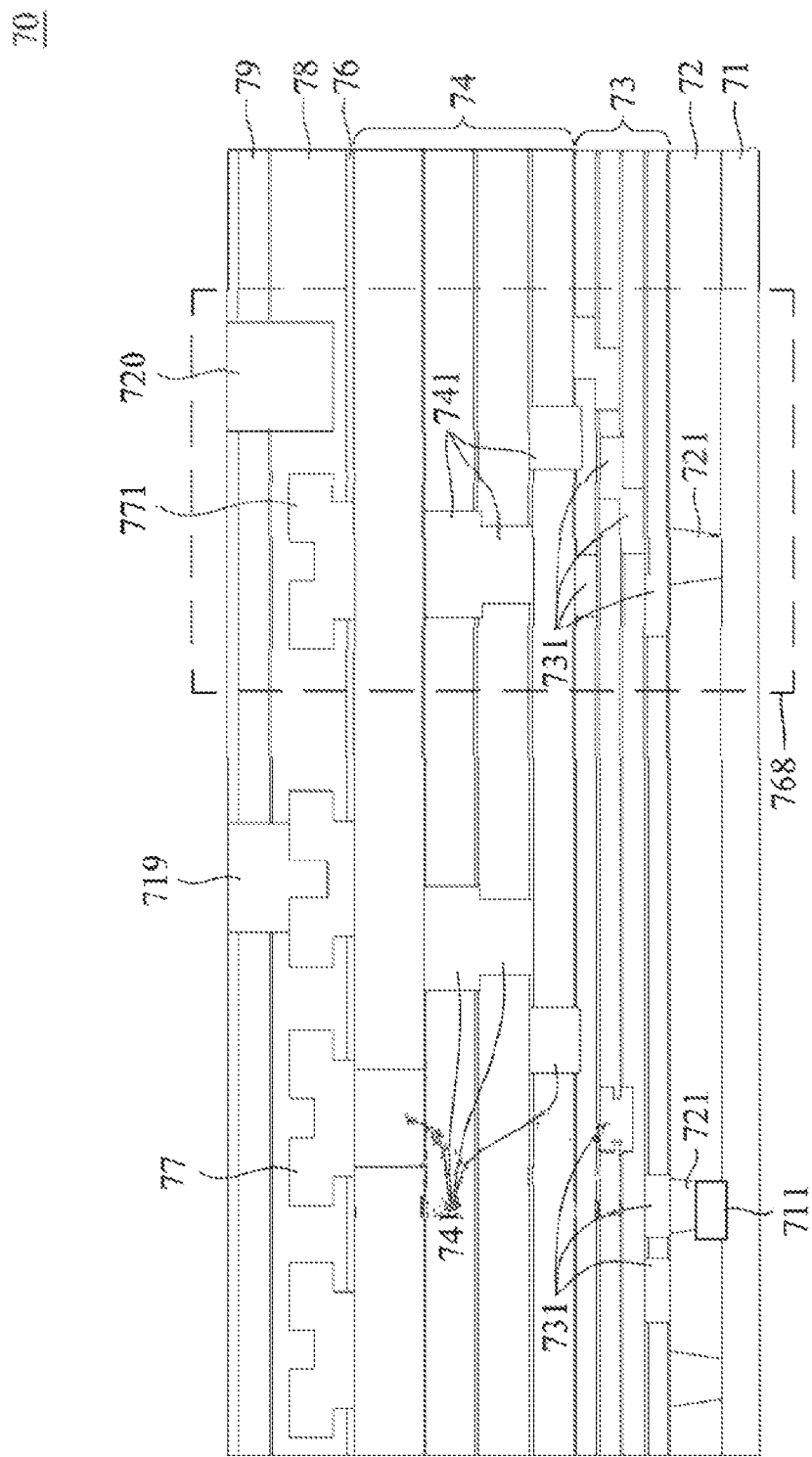
FIG. 7 is a cross-sectional view illustrating a semiconductor device according to an exemplary embodiment.

FIG. 7 illustrates an example of a dummy pattern for addressing the aforementioned side effects in fabricating die group structure in accordance with the present disclosure. Referring to FIG. 7, the semiconductor device 70 includes a substrate (e.g., silicon substrate) 71, an interlayer dielectric layer 72 on the substrate 71, a plurality of contacts 721 extending through the interlayer dielectric layer 72 and electrically coupled to devices on the substrate 71. In an embodiment, the contacts 721 include tungsten (W). The semiconductor device 70 also includes a lower intermetal dielectric (IM) layer structure 73 overlying the interlayer dielectric layer 72, and an upper intermetal dielectric layer structure 74 overlying the lower intermetal dielectric layer structure 73. In an embodiment, the lower intermetal dielectric layer structure 73 includes a plurality of extremely low-k dielectric layers and low-k dielectric layers having a dielectric constant (k value) smaller than about 3.5. The upper intermetal dielectric layer structure 74 includes one or more dielectric layers having a k value about 3.5 or higher. For example, the upper intermetal dielectric layer structure 74 may include undoped silicate glass (USG), fluorosilicate glass (FSG), silicon oxide, and the like. That is, the lower intermetal dielectric (IM) layer structure 73 has a dielectric material having a dielectric constant smaller than the dielectric constant of the top intermetal dielectric layer structure 74. A plurality of metal lines and vias 731 are disposed in the lower intermetal dielectric layer structure 73, and a plurality of metal lines and vias 741 are disposed in the upper intermetal dielectric layer structure 74. In an embodiment, the metal lines may include trenches filled with a metal, such as copper (Cu), aluminum (Al), tungsten (W), other conductive materials, or alloys thereof. The semiconductor device 70 also includes a passivation layer 76 overlying the upper intermetal dielectric layer 74, a plurality of contact pads 77 including a metal structure, e.g., aluminum or copper contact pads, on the passivation layer 76, and a dielectric layer 78 overlying the contact pads 77 and the passivation layer 76. The semiconductor device 70 further includes a bonding layer 79 overlying the dielectric layer 78, and a bonding metal structure 719 extending through the dielectric layer 78 and electrically connected to the contact pads 77. In an embodiment, the bonding metal structure 719 is formed by depositing a metal material on the bonding layer 79, and a polishing (e.g., chemical mechanically polishing) process is performed on the metal material so that the bonding metal structure 719 has an upper surface substantially flush with an upper surface of the bonding layer 79. Since polishing involves applying polishing pads on the surface of the semiconductor device 70, dishing can occur in a large area of the metal material, particularly, in regions above the intermetal dielectric layer structure 73 where the low-k dielectric layers have low metal line density.

In some embodiments, a dummy pattern structure 768 is added to the semiconductor device 70. The dummy pattern structure 768 includes a dummy conductive pattern, e.g., trenches filled with a metallic material in the lower intermetal dielectric layer structure 73, and in the upper dielectric layer structure 74, a metal pad 771 in the dielectric layer 78, and a dummy contact pad structure 720 exposed at the planar upper surface of the bonding layer 79 to increase the metal pattern density to reduce or eliminate the dishing effect. In some embodiments, dishing and erosion effects can be effectively reduced when the plurality of metal lines and vias 731 disposed in the lower intermetal dielectric layer structure 73 have a first pattern density that is equal to or greater than a second pattern density of the plurality of metal lines and vias 741 disposed in the upper intermetal dielectric layer structure 74. In some embodiments, dishing and erosion effects can be effectively reduced when the dummy pattern density of the dummy contact pad structure 720 is in a range of about +/−50 percent (e.g., 60%, 100%, 130%, 150%) of a pattern density of the bonding metal structure 719. The pattern density refers to the number of conductive elements (e.g., metal lines, vias) in a given area or volume of the at least one dielectric layer. The pattern density also refers to the area or volume of conductive elements divided by the respective non-conductive pattern area or volume. In an embodiment, the metal lines and vias in the dummy pattern structure 768 are not connected to devices 711 on the substrate 71 and have no function with respect to electrical circuit functions. In other words, unwanted loss (dishing and erosion) of the bonding layer 79 and bonding metal 719 is reduced or eliminated when a dummy pattern structure 768 is added to the semiconductor device 70. It is noted that the upper intermetal dielectric layer 74 includes one or more dielectric layers having a dielectric constant value that is greater than the dielectric constant value of the intermetal dielectric layer structure 73.

Figure 8:
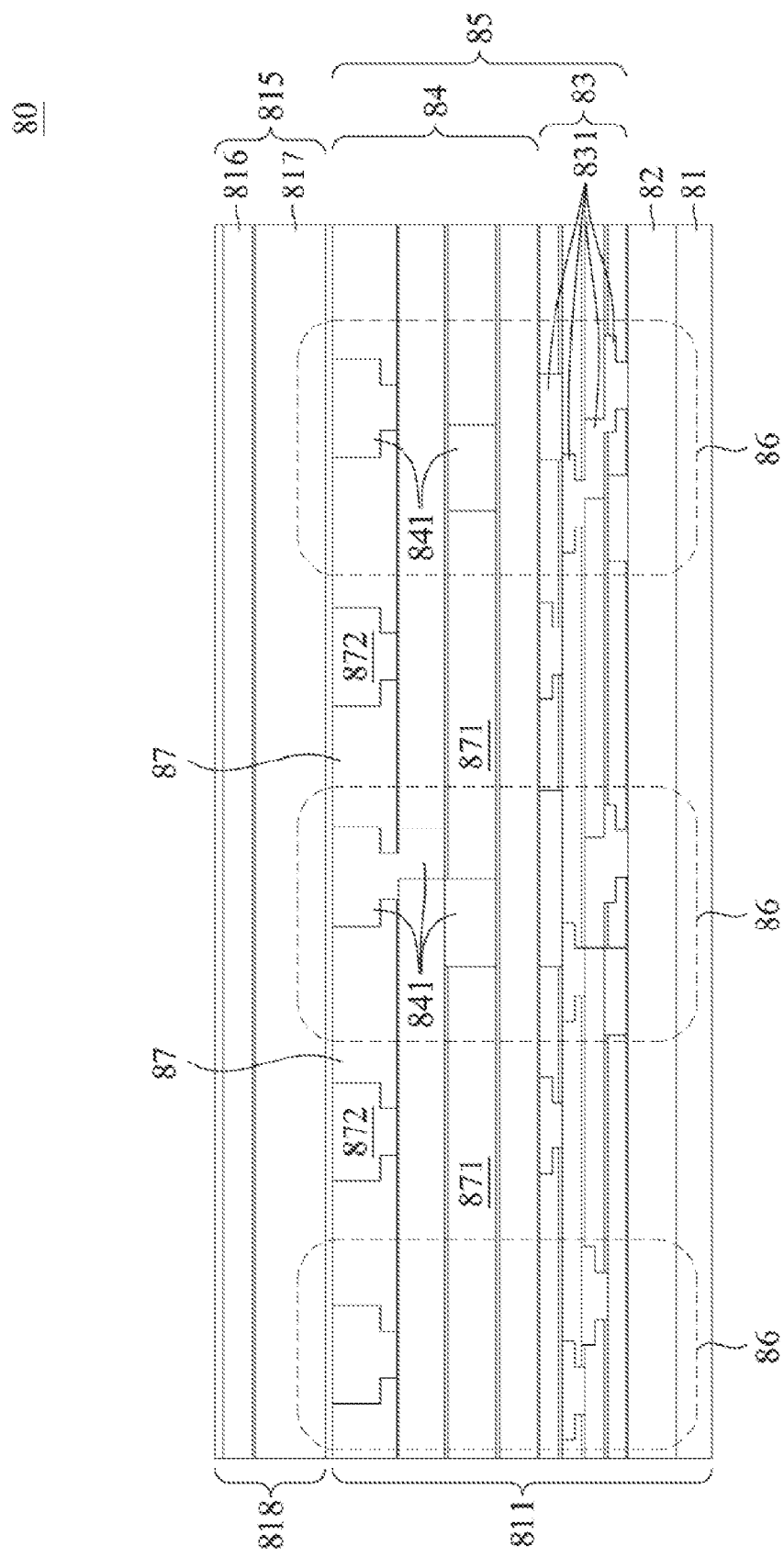
FIG. 8 is a cross-sectional view illustrating a semiconductor device according to an exemplary embodiment.

FIG. 8 illustrates another example of a dummy pattern for addressing the aforementioned side effects in fabricating die group structure in accordance with the present disclosure. Referring to FIG. 8, the semiconductor device 80 includes a substrate 81, an interlayer dielectric layer 82 on the substrate 81, and an intermetal dielectric structure 85 on the interlayer dielectric layer 82. The intermetal dielectric structure 85 includes a lower intermetal dielectric layer structure 83 overlying the interlayer dielectric layer 82, and an upper intermetal dielectric layer structure 84 overlying the lower intermetal dielectric layer structure 83. The lower intermetal dielectric layer structure 83 includes a plurality of extremely low-k dielectric layers and low-k dielectric layers having a dielectric constant smaller than about 3.5, smaller than about 3.0, and smaller than about 2.5. The upper intermetal dielectric layer structure 84 includes a plurality of dielectric layers having a dielectric constant about 3.5, about 3.7, and about 3.9. A plurality of metal lines and vias 831 are disposed in the intermetal dielectric layer structure 83. A circuit structure 87 including a plurality of circuits 871 is disposed in the top intermetal dielectric layer structure 84.

As described above, when the upper surface of the semiconductor device 80 is planarized using a chemical mechanical polishing (CMP) process such that the circuit structure 87 has an upper surface flush with the upper surface of the semiconductor device 80, dishing may occur because of the porous and soft low-k intermediate dielectric layer structures 83 and 84. In some embodiments, a dummy pattern structure 86 is inserted between two or more adjacent circuits 871, the dummy pattern structure 86 includes a dummy conductive pattern, e.g., dummy metal lines and vias, that can be connected to a voltage supply source, to ground or in a floating state. The dummy pattern structure 86 does not have electrical circuit functions and has only the purpose of increasing the conductive pattern density of the semiconductor device 80. In an embodiment, the dummy pattern structure 86 includes a first conductive pattern 831 having a first pattern density in the lower intermetal dielectric layer structure 83 and a second conductive pattern 841 having a second pattern density in the upper intermetal dielectric layer structure 84. The first pattern density of the first conductive pattern 831 is equal to or greater than the second pattern density of the second conductive pattern 841. In an embodiment, the semiconductor device 80 also includes a bonding member 815 including one or more bonding layers 816, 817 having an edge surface 818 substantially flush with a planar side surface 811 of the semiconductor device 80. In an embodiment, the semiconductor device 80 can be mounted perpendicularly on a planar surface of a base or carrier substrate using the planar side surface 811 and the edge surface 818.

In some embodiments, a contact pad structure 872 of the circuit structure 87 has a conductive pattern density that is configured to satisfy input-and-output (I/O) power requirements of the semiconductor device 80, i.e., the conductive pattern density of the contact pad structure 872 of the circuit structure 87 is at least equal to or greater than the power density of the I/O power supply. In some embodiments, the conductive pattern density of the contact pad structure 872 of the circuit structure 87 is configured to satisfy core power requirements of the semiconductor device 80, i.e., the conductive pattern density of the contact pad structure 872 of the circuit structure 87 is at least equal to or greater than the power density of the core power supply.

Figure 9:
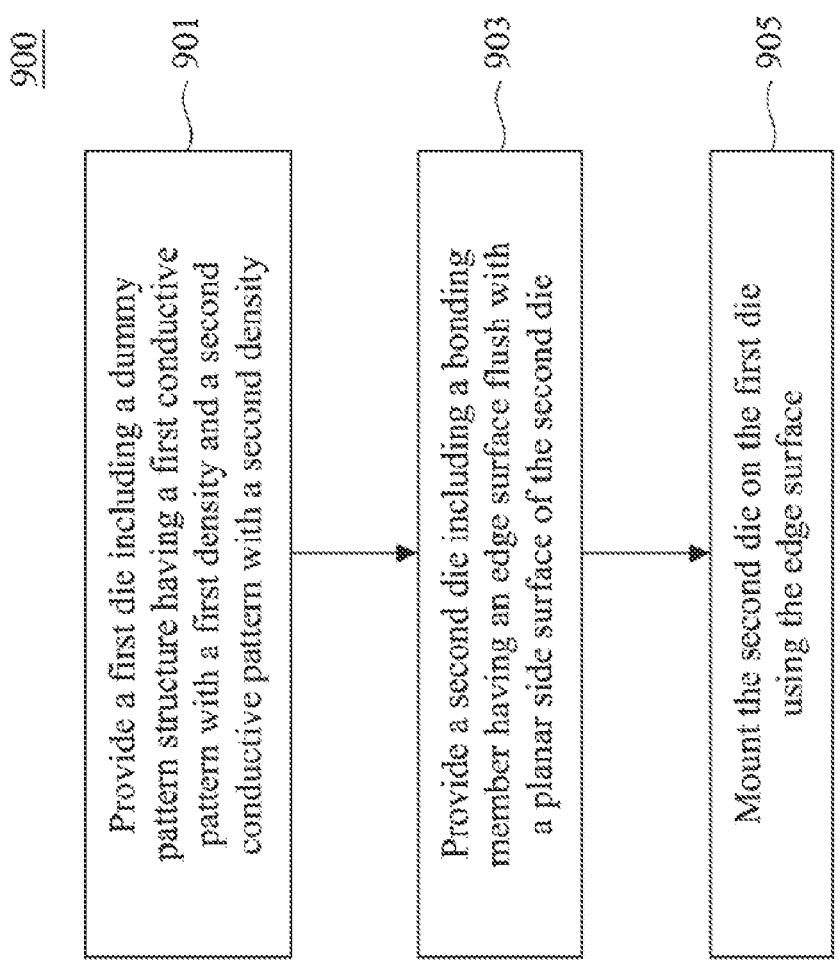
FIG. 9 is a simplified flowchart illustrating a method of forming a multi-die semiconductor device according to an exemplary embodiment.

FIG. 9 is a simplified flowchart illustrating a method 900 of forming a multi-die semiconductor device according to an exemplary embodiment. Referring to FIG. 9, the method 900 includes, in block 901, providing a first semiconductor die including a substrate, at least one first dielectric layer on the substrate and having a first dielectric constant value, and at least one second dielectric layer on the substrate and having a second dielectric constant value that is greater than the first dielectric constant value. The first semiconductor die also includes a dummy pattern structure including a first conductive pattern in the at least one first dielectric layer with a first pattern density and a second conductive pattern in the at least one second dielectric layer with a second pattern density. The first pattern density is equal to or greater than the second pattern density. The pattern density refers to the number of conductive elements (e.g., metal lines, vias) in a given area or volume of the at least one dielectric layer. The pattern density also refers to the area or volume of conductive elements divided by the respective non-conductive pattern area or volume. The first semiconductor die further includes an active pattern structure having a plurality of active structures, where one or more active structures are disposed on opposite sides of the dummy pattern structure. That is, the dummy pattern structure is disposed between two or more active structures and electrically separated from the active pattern structure. In an embodiment, the first semiconductor die can be the semiconductor device 60 of FIG. 6.

The method 900 further includes, in block 903, providing a second semiconductor die including a substrate, at least one first dielectric layer on the substrate and having a first dielectric constant value, and at least one second dielectric layer on the substrate and having a second dielectric constant value that is greater than the first dielectric constant value. The second semiconductor die also includes a dummy pattern structure including a first conductive pattern in the at least one first dielectric layer with a first pattern density and a second conductive pattern in the at least one second dielectric layer with a second pattern density. The first pattern density is equal to or greater than the second pattern density. The second semiconductor die also includes an active pattern structure having a plurality of active structures, and the dummy pattern structure is electrically separated from the active pattern structure and has no function with respect to electrical circuit functions.

The second semiconductor die also includes a bonding member disposed on its upper surface. The bonding member includes an edge portion that is substantially flush with a planar side surface of the second semiconductor die. In an embodiment, the second semiconductor die can be similar to the semiconductor device 80 of FIG. 8.

In block 905, the method 900 further includes mounting the second semiconductor die vertically or perpendicularly on the first semiconductor die with the edge portion in direct contact with an upper surface of the first semiconductor die. In an embodiment, mounting the second semiconductor die vertically or perpendicularly on the first semiconductor die includes a hybrid bonding with oxide-to-oxide bonding and/or metal-to-metal bonding.

Figure 10:
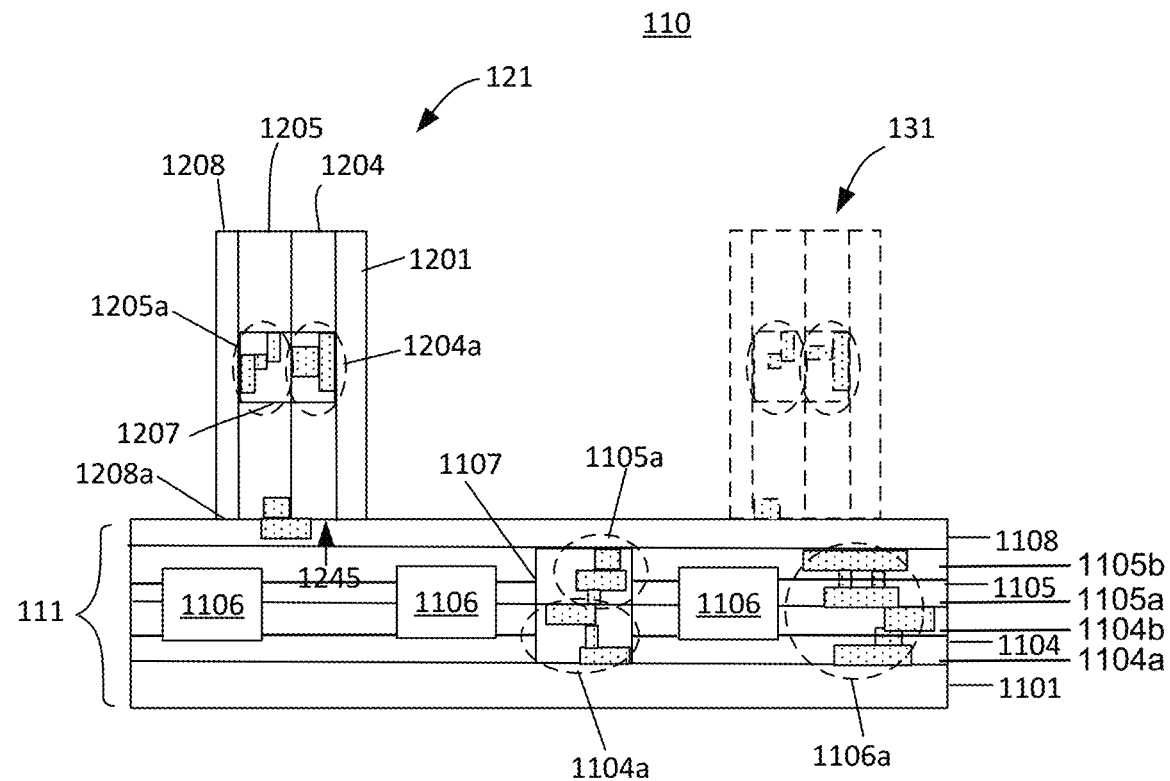
FIG. 10 is a simplified cross-sectional view of a semiconductor device according to some embodiments.

FIG. 10 illustrates yet another example of a dummy pattern for addressing the aforementioned side effects in fabricating a die group structure in accordance with the present disclosure. Referring to FIG. 10, the semiconductor device 110 includes a first semiconductor die 111 and a second semiconductor die 121 mounted perpendicularly on the first semiconductor die 111. The first semiconductor die 111 includes a substrate 1101, a lower intermetal (IM) layer structure 1104 (e.g., 1104a and 1104b, as shown in FIG. 10) having one or more lower IM layers on the substrate 1101, an upper intermetal layer structure 1105 (e.g., 1105a and 1105b, as shown in FIG. 10) having one or more upper IM layers on the lower intermetal layer 1104, and a bonding layer 1108 on the upper intermetal layer structure 1105. The first semiconductor die 111 also includes a plurality of active pattern structures 1106 on the substrate 1101 and a dummy pattern structure 1107 disposed between two or more active pattern structures 1106. In an embodiment, the upper IM layer structure 1105 has a dielectric constant value greater than that of the lower IM layer structure 1104; the dummy pattern structure 1107 includes a first conductive pattern 1104a having a first pattern density in the lower IM layer structure 1104, and a second conductive pattern 1105a having a second pattern density in the upper IM layer structure 1105; and the first pattern density is equal to or greater than the second pattern density. In some embodiments, the active pattern structures 1106 include a plurality of active metal lines and active vias 1106a on the substrate and in the lower and upper IM layer structures 1104, 1105. The dummy pattern structure 1107 including the first and second conductive patterns 1104a, 1105a, are electrically not connected to the active metal lines and active vias 1106a of the active pattern structures 1106.

The second semiconductor die 121 includes a substrate 1201, a lower intermetal (IM) layer structure 1204 having one or more lower IM layers on the substrate 1201, an upper intermetal layer structure 1205 having one or more upper IM layers on the lower intermetal layer structure 1204, and a bonding layer 1208 on the upper intermetal layer structure 1205. The bonding layer 1208 has an edge surface 1208a flush with a planar side surface 1245 of the second semiconductor die 121. The second semiconductor die 121 also includes a plurality of active pattern structures on the substrate 1201 and a dummy pattern structure 1207 disposed between two or more active pattern structures. In an embodiment, the upper IM layer structure 1205 has a dielectric constant value greater than that of the lower IM layer structure 1204, the dummy pattern structure 1207 includes a first conductive pattern 1204a having a first pattern density in the lower IM layer structure 1204, and a second conductive pattern 1205a having a second pattern density in the upper IM layer structure 1105; and the first pattern density is equal to or greater than the second pattern density. In some embodiments, the second semiconductor die 121 is mounted to the first semiconductor die 111 by bonding its edge surface and planar side surface to an upper surface of the bonding layer 1108.

In some embodiments, it should be noted that a third semiconductor die 131 (indicated by a dotted line box) can also be similarly mounted on the first semiconductor die 111, as shown in FIG. 10. In some embodiments, it should be noted that, instead of the second or third semiconductor die, one or more die stacks similar to the first and second die groups 501, 502 of FIG. 7 can also be mounted on the first semiconductor die 111.

Embodiments provide a device that includes a substrate, at least one first dielectric layer on the substrate and having a first dielectric constant value, and at least one second dielectric layer on the at least one first dielectric layer and having a second dielectric constant value that is greater than the first dielectric constant value. The device also includes a dummy pattern containing a first conductive pattern having a first pattern density in the at least one first dielectric layer and a second conductive pattern in the at least one second dielectric layer and comprising a second pattern density. The first pattern density is equal to or greater than the second pattern density.

Embodiments also provide a semiconductor device including a first die and a second die. The first die is vertically mounted to a main surface of the second die. The first die includes a first substrate, at least one first dielectric layer on the first substrate and having a first dielectric constant value, at least one second dielectric layer on the at least one first dielectric layer and having a second dielectric constant value greater than the first dielectric constant value, a first dummy pattern containing a first conductive pattern having a first pattern density in the at least one first dielectric layer and a second conductive pattern having a second pattern density in the at least one second dielectric layer, and a second die vertically mounted on the first die. The first pattern density is equal to or greater than the second pattern density.

Embodiments also provide a method of fabricating a semiconductor device. The method includes: providing a first semiconductor die including a dummy pattern structure having a first conductive pattern with a first pattern density in an at least one first dielectric layer and a second conductive pattern with a second pattern density in an at least one second dielectric layer over the at least one first dielectric layer, and a planar interface layer on the at least one second dielectric layer, wherein the first pattern density is equal to or greater than the second pattern density. The method also includes providing a second semiconductor die including a bonding member having an edge surface flush with a planar side surface of the second semiconductor die, and mounting the second semiconductor die perpendicularly on the planar interface layer of the first semiconductor die.

The foregoing merely outlines features of embodiments of the disclosure. Various modifications and alternatives to the described embodiments will be apparent to those skilled in the art in view of the teachings herein. Those skilled in the art will appreciate that equivalent constructions do not depart from the scope of the present disclosure, and that they may make various changes, substitutions, and alterations herein without departing from the spirit and scope of the present disclosure.

What is claimed is:

1. A semiconductor device comprising:
   a first die comprising:
      a first substrate;
      at least one device formed on the first substrate;
      an interlayer dielectric layer on the first substrate;
      an intermetal dielectric layer on the interlayer dielectric layer and above the at least one device, the intermetal dielectric layer comprising:
         at least one first dielectric layer on the first substrate and comprising a first dielectric constant value;
         at least one second dielectric layer on the at least one first dielectric layer and comprising a second dielectric constant value greater than the first dielectric constant value; and
         a first dummy pattern comprising a first conductive pattern having a first dummy pattern density in the at least one first dielectric layer and a second conductive pattern having a second dummy pattern density in the at least one second dielectric layer, wherein the first dummy pattern density is greater than the second dummy pattern density; and
   a second die vertically mounted on the first die.

2. The semiconductor device of claim 1, wherein the first die further comprises a plurality of first active structures, and the first dummy pattern is disposed between two or more first active structures and electrically not connected to the first active structures.

3. The semiconductor device of claim 2, wherein the plurality of first active structures comprise a plurality of active metal lines and active vias on the first substrate, and the first dummy pattern comprises a plurality of dummy metal lines and dummy vias on the first substrate that have no function with respect to electrical circuit functions.

4. The semiconductor device of claim 1, wherein the second die comprises:
- a second substrate;
- at least one lower dielectric layer on the second substrate and comprising a low-k dielectric constant value smaller than a dielectric constant of silicon oxide;
- at least one upper dielectric layer on the at least one lower dielectric layer and comprising a dielectric constant value greater than the low-k dielectric constant value;
- a second dummy pattern comprising a third conductive pattern having a third dummy pattern density in the at least one lower dielectric layer and a fourth conductive pattern having a fourth dummy pattern density in the at least one upper dielectric layer, wherein the third dummy pattern density is greater than the fourth dummy pattern density.

5. The semiconductor device of claim 4, wherein the second die further comprises a second bonding member disposed on an upper surface of the second die and comprises an edge surface flush with a planar side surface of the second die, the first die further comprises a first bonding member disposed on the first die and has a planar upper surface, and the second die is bonded on the planar upper surface of the first die using the edge surface of the second die.

6. The semiconductor device of claim 5, wherein the second die further comprises a fifth conductive pattern in the planar side surface of the second die, the first die further comprises a sixth conductive pattern having a surface flush with the planar upper surface of the first die, and the fifth conductive pattern of the second die is bonded to the sixth conductive pattern of the first die.

7. The semiconductor device of claim 4, wherein the second die further comprises a plurality of second active structures, and the second dummy pattern is disposed between two or more second active structures and electrically not connected to the second active structures.

8. The semiconductor device of claim 7, wherein the plurality of second active structures comprise a plurality of active metal lines and active vias on the second substrate, and the second dummy pattern comprises a plurality of second dummy metal lines and second dummy vias on the second substrate that have no function with respect to electrical circuit functions.

9. The semiconductor device of claim 3, wherein the first die further comprises a first planar interface layer including a first bonding layer and a first conductive contact structure, the second die comprises a second planar interface layer including a second bonding layer and a second contact structure, and the first die and the second die are bonded together through the first and second planar interface layers.

10. A semiconductor package comprising:
a first die comprising:
- a first substrate;
- at least one device formed on the first substrate;
- an interlayer dielectric layer on the first substrate;
- an intermetal dielectric layer on the interlayer dielectric layer and above the at least one device, the intermetal dielectric layer comprising:
  - a plurality of first dielectric layers disposed on the first substrate, the plurality of the first dielectric layers having a first dielectric constant value;
  - a plurality of second dielectric layers disposed on the plurality of the first dielectric layers, the plurality of second dielectric layers having a second dielectric constant value greater than the first dielectric constant value; and
  - a first dummy pattern comprising a first dummy conductive pattern having a first dummy pattern density disposed in the plurality of the first dielectric layers and a second dummy conductive pattern having a second dummy pattern density disposed in the plurality of the second dielectric layers, wherein the first dummy pattern density is greater than the second dummy pattern density; and
a second die vertically mounted on the first die.

11. The semiconductor package of claim 10, wherein the first die further comprises a plurality of active structures, wherein the first dummy pattern is disposed between two or more active structures.

12. The semiconductor package of claim 10, wherein the first dielectric constant value is smaller than a dielectric constant of silicon oxide, and the second dielectric constant value is greater than the first dielectric constant value.

13. The semiconductor package of claim 10, wherein the first dummy conductive pattern and the second dummy conductive pattern are not connected.

14. The semiconductor package of claim 10, wherein the first dummy pattern density is greater than the second dummy pattern density such that dishing is reduced during a planarization process.

15. The semiconductor package of claim 10, wherein the second die comprises:
- a second substrate;
- a plurality of third dielectric layers disposed on the second substrate, the plurality of the third dielectric layers having a third dielectric constant value;
- a plurality of fourth dielectric layers disposed on the plurality of the third dielectric layers, the plurality of fourth dielectric layers having a fourth dielectric constant value greater than the third dielectric constant value; and
- a second dummy pattern comprising a third dummy conductive pattern having a third dummy pattern density disposed in the plurality of the third dielectric layers and a fourth dummy conductive pattern having a fourth dummy pattern density disposed in the plurality of the fourth dielectric layers, wherein the third dummy pattern density is greater than the fourth dummy pattern density.

16. A semiconductor package comprising:
a first die comprising:
- a first substrate;
- at least one device formed on the first substrate;
- an interlayer dielectric layer on the first substrate;
- an intermetal dielectric layer on the interlayer dielectric layer and above the at least one device, the intermetal dielectric layer comprising:
  - a plurality of first dielectric layers disposed on the first substrate, the plurality of the first dielectric layers are characterized by a first dielectric constant value;
  - a plurality of second dielectric layers disposed on the plurality of the first dielectric layers, the plurality of second dielectric layers are characterized by a second dielectric constant value greater than the first dielectric constant value; and
  - a first dummy pattern comprising:
    - a first dummy conductive pattern disposed in the plurality of the first dielectric layers; and
    - a second dummy conductive pattern disposed in the plurality of the second dielectric layers, wherein the first dummy conductive pattern is characterized by a first dummy pattern density, and the second dummy conductive pattern is characterized by a second dummy pattern density, the first dummy pattern density being greater than the second dummy pattern density; and a second die vertically mounted on the first die.

17. The semiconductor package of claim 16, wherein the first die further comprises a plurality of active structures, wherein the first dummy pattern is disposed between two or more active structures.

18. The semiconductor package of claim 16, wherein the first dielectric constant value is smaller than a dielectric constant of silicon oxide, and the second dielectric constant value is greater than the first dielectric constant value.

19. The semiconductor package of claim 16, wherein the first dummy conductive pattern and the second dummy conductive pattern are not connected.

20. The semiconductor package of claim 16, wherein the first dummy pattern density is greater than the second dummy pattern density such that dishing is reduced during a planarization process.

\* \* \* \* \*